(12) United States Patent
Ito et al.

(10) Patent No.: US 10,367,473 B2
(45) Date of Patent: Jul. 30, 2019

(54) FILTER, MULTIPLEXER, AND COMMUNICATION APPARATUS

(71) Applicant: KYOCERA Corporation, Kyoto-shi, Kyoto (JP)

(72) Inventors: Motoki Ito, Kyoto (JP); Tomonori Urata, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 148 days.

(21) Appl. No.: 15/546,253

(22) PCT Filed: Jan. 27, 2016

(86) PCT No.: PCT/JP2016/052345
§ 371 (c)(1),
(2) Date: Jul. 25, 2017

(87) PCT Pub. No.: WO2016/121818
PCT Pub. Date: Aug. 4, 2016

(65) Prior Publication Data
US 2018/0026605 A1    Jan. 25, 2018

(30) Foreign Application Priority Data

Jan. 27, 2015  (JP) .................................. 2015-013557
Apr. 10, 2015  (JP) .................................. 2015-081105

(51) Int. Cl.
*H03H 9/72*    (2006.01)
*H03H 9/145*    (2006.01)
(Continued)

(52) U.S. Cl.
CPC .................. *H03H 9/72* (2013.01); *H01P 1/20* (2013.01); *H01Q 1/2283* (2013.01); *H01Q 5/50* (2015.01);
(Continued)

(58) Field of Classification Search
CPC ............... H03H 9/02685; H03H 9/145; H03H 9/14547; H03H 9/6483; H03H 9/72;
(Continued)

(56) References Cited

U.S. PATENT DOCUMENTS 5,543,757 A * 8/1996 Kobayashi ........... H03H 9/0274
333/193
5,559,481 A   9/1996 Satoh et al.
(Continued)

FOREIGN PATENT DOCUMENTS

JP    H05-183380 A    7/1993
JP    H06-61783 A     3/1994
(Continued)

OTHER PUBLICATIONS

English language machine translation of JP 2014-068123 A, published Apr. 17, 2014, 5 pages. (Year: 2014).*
(Continued)

*Primary Examiner* — Barbara Summons
(74) *Attorney, Agent, or Firm* — Procopio Cory Hargreaves and Savitch LLP

(57) ABSTRACT

An input port, an output port, and a plurality of serial resonators and a plurality of parallel resonators connected in a ladder type between the input port and the output port and including IDT electrodes are provided. The plurality of parallel resonators include at least one first parallel resonator having a resonance frequency lower than resonance frequencies of the plurality of serial resonators, and at least one second parallel resonator having a resonance frequency higher than antiresonance frequencies of the plurality of serial resonators.

13 Claims, 22 Drawing Sheets

(51) Int. Cl.
*H01Q 5/50* (2015.01)
*H03H 9/64* (2006.01)
*H03H 9/02* (2006.01)
*H01Q 1/22* (2006.01)
*H01P 1/20* (2006.01)
*H01Q 1/24* (2006.01)
*H01Q 21/00* (2006.01)

(52) U.S. Cl.
CPC ........ *H03H 9/02685* (2013.01); *H03H 9/145* (2013.01); *H03H 9/14547* (2013.01); *H03H 9/6483* (2013.01); *H03H 9/725* (2013.01); *H01Q 1/242* (2013.01); *H01Q 21/0006* (2013.01)

(58) Field of Classification Search
CPC ........ H03H 9/725; H01P 1/20; H01Q 1/2283; H01Q 1/242; H01Q 5/50; H01Q 21/0006
USPC .......... 333/133, 193–196; 310/313 B, 313 D
See application file for complete search history.

(56) References Cited

U.S. PATENT DOCUMENTS

| | | | | |
|---|---|---|---|---|
| 5,729,186 | A * | 3/1998 | Seki | H03H 9/6483 310/313 A |
| 5,844,453 | A * | 12/1998 | Matsui | H03H 9/14552 333/193 |
| 2001/0008387 | A1 * | 7/2001 | Taniguchi | H03H 9/6483 333/193 |
| 2002/0153969 | A1 * | 10/2002 | Inoue | H03H 9/14526 333/195 |
| 2010/0134203 | A1 | 6/2010 | Inoue et al. | |
| 2010/0207707 | A1 * | 8/2010 | Yata | H03H 9/14594 333/195 |
| 2013/0099875 | A1 | 4/2013 | Shimizu et al. | |
| 2014/0145557 | A1 | 5/2014 | Tanaka | |
| 2014/0197903 | A1 | 7/2014 | Uesaka | |
| 2014/0218129 | A1 | 8/2014 | Fujiwara et al. | |
| 2016/0126932 | A1 | 5/2016 | Nakai et al. | |
| 2017/0093372 | A1 | 3/2017 | Yokoyama | |

FOREIGN PATENT DOCUMENTS

| | | | |
|---|---|---|---|
| JP | 09-232906 A | * | 9/1997 |
| JP | H10-145183 A | | 5/1998 |
| JP | 10-270981 A | * | 10/1998 |
| JP | 2000-13181 A | | 1/2000 |
| JP | 2007-060412 A | | 3/2007 |
| JP | 2008-98902 A | | 4/2008 |
| JP | 2014-068123 A | | 4/2014 |
| WO | 2012/140831 A1 | | 10/2012 |
| WO | 2013/002033 A1 | | 1/2013 |
| WO | 2013/046892 A1 | | 4/2013 |
| WO | 2013/080461 A1 | | 6/2013 |
| WO | 2014/196245 A1 | | 12/2014 |
| WO | 2015/198709 A1 | | 12/2015 |

OTHER PUBLICATIONS

Office Action dated Sep. 19, 2017 issued in counterpart Japanese Application No. 2016-549166.
International Search Report dated Apr. 19, 2016, issued by Japan Patent Office for International Application No. PCT/JP2016/052345.

* cited by examiner

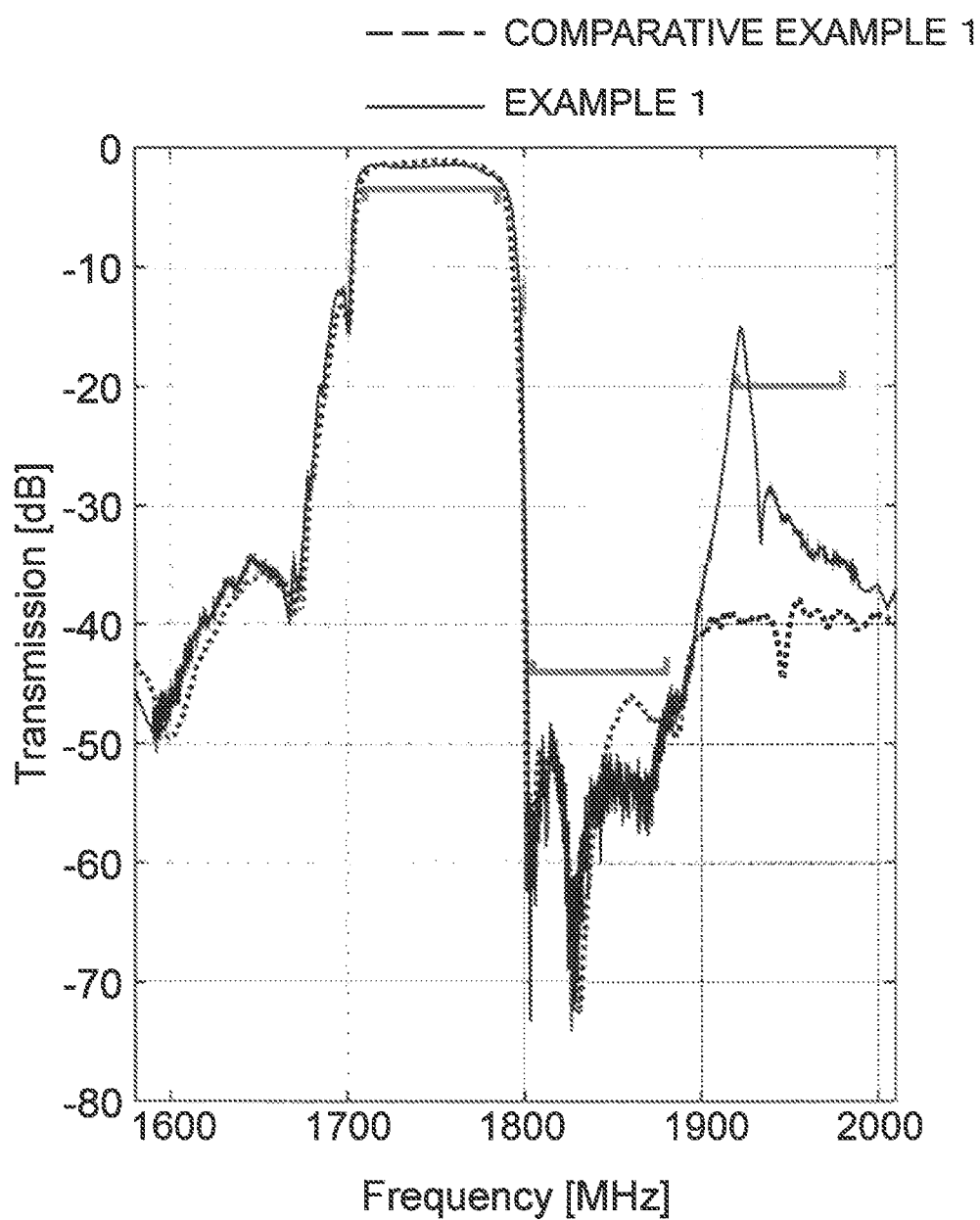

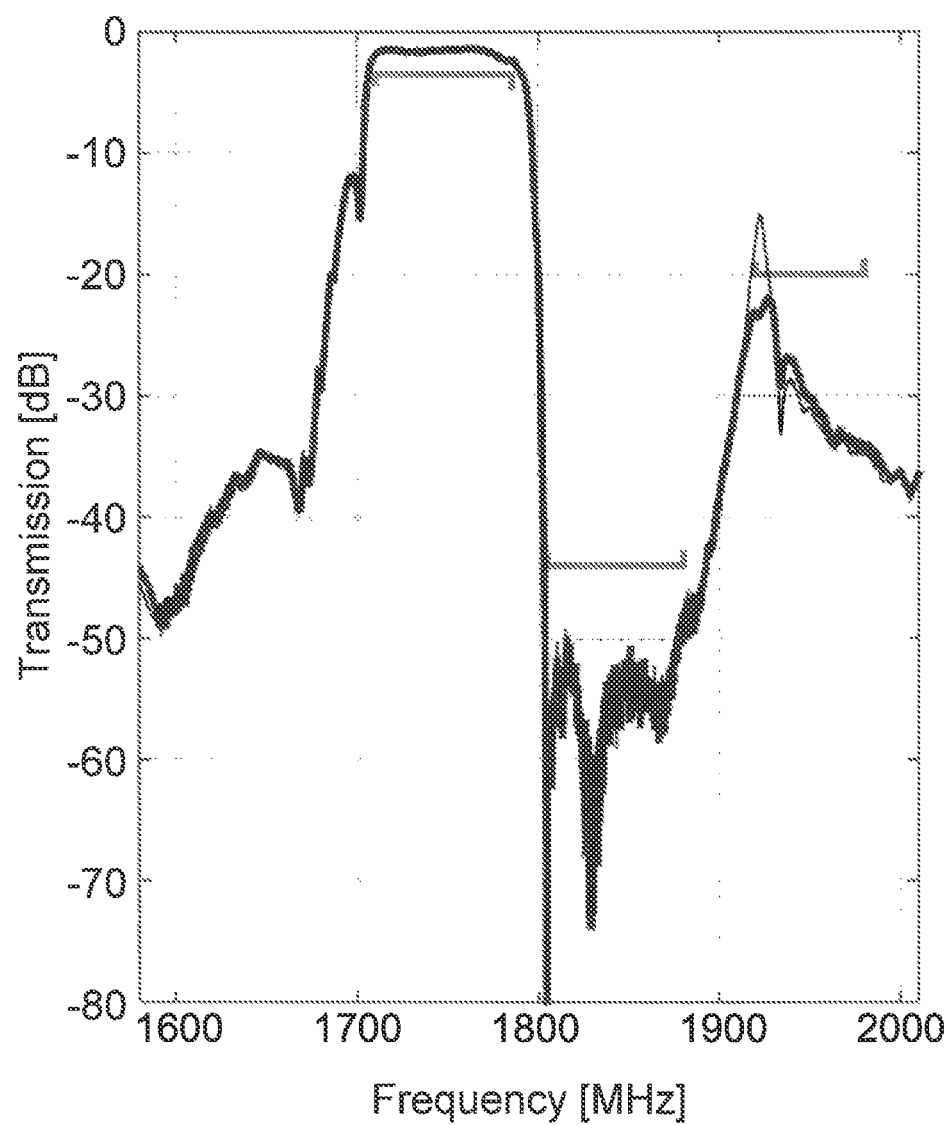

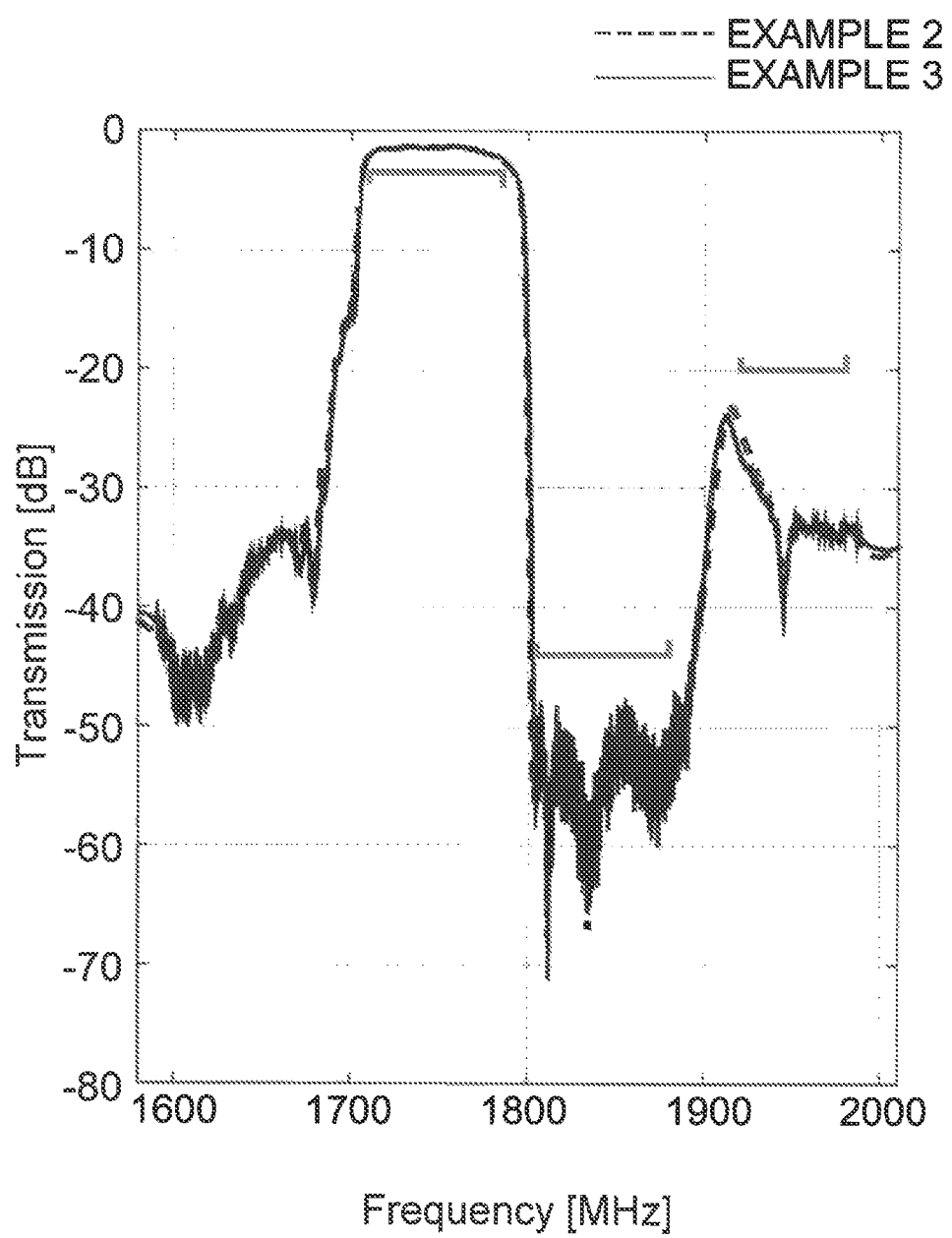

US 10,367,473 B2

FILTER, MULTIPLEXER, AND COMMUNICATION APPARATUS

TECHNICAL FIELD

The present invention relates to a filter and to a multiplexer and a communication apparatus using the same.

BACKGROUND ART

In recent years, in mobile terminals or other communication apparatuses, acoustic wave elements have been used in the filters filtering the signals which are transmitted to and received from their antennas. An acoustic wave element is configured by a piezoelectric substrate and an excitation electrode formed on a major surface of the piezoelectric substrate. The filter utilizes the characteristic that an electrical signal and a surface acoustic wave can be converted to each other due to the relationship between the excitation electrode and the piezoelectric substrate.

Japanese Patent Publication No. 5-183380A discloses a filter configured by connecting a plurality of acoustic wave elements in a ladder type.

SUMMARY OF INVENTION

A filter according to one embodiment of the present disclosure includes an input port, an output port, a plurality of serial resonators, and a plurality of parallel resonators. The plurality of serial resonators and the plurality of parallel resonators include IDT electrodes and are connected in a ladder type between the input port and the output port. Further, the plurality of parallel resonators include at least one first parallel resonator and at least one second parallel resonator. A first parallel resonator has a resonance frequency lower than resonance frequencies of the serial resonators. A second parallel resonator has a higher resonance frequency than antiresonance frequencies of the serial resonators.

A multiplexer according to one embodiment of the present disclosure includes a first terminal, a second terminal, a third terminal, a first filter, and a second filter. The first filter includes the above filter which is electrically connected between the first terminal and the second terminal. The second filter is electrically connected between the first terminal and the third terminal and has a passband on a higher frequency side than a passband of the first filter.

A communication apparatus according to one embodiment of the present disclosure includes an antenna, the above multiplexer which is electrically connected to the antenna, and an RF-IC which is electrically connected to the multiplexer.

BRIEF DESCRIPTION OF DRAWINGS

FIG. 10 is a graph showing results of simulation of filter characteristics of filters according to Example 1 and Comparative Example 1.

FIG. 12 is a graph showing results of simulation of filter characteristics of filters according to Example 1 and Example 2.

FIG. 13 is a graph showing results of simulation of filter characteristics of filters according to Example 2 and Example 3.

DESCRIPTION OF EMBODIMENTS

Figure 1:
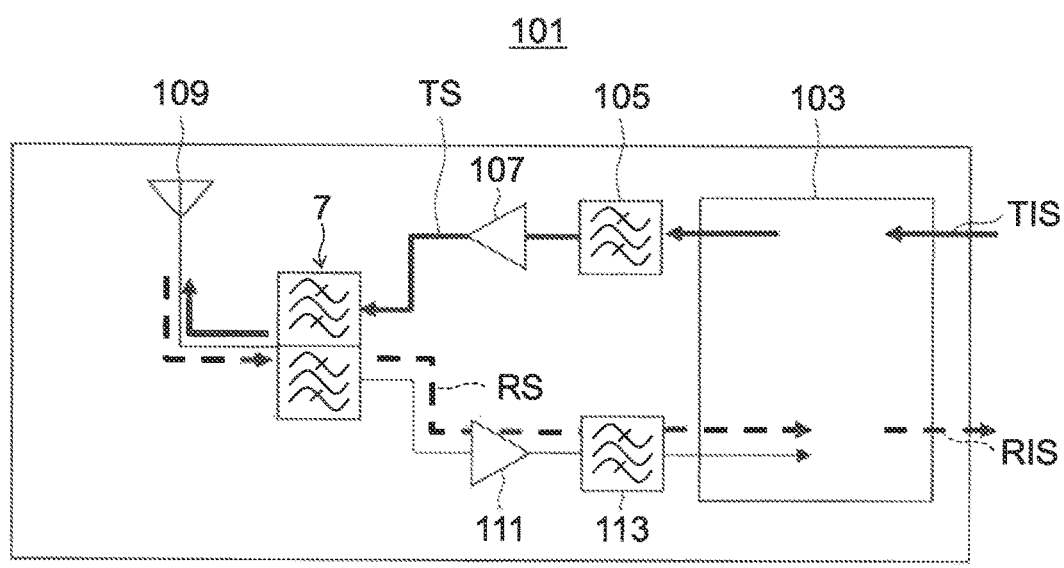
FIG. 1 is a schematic view of a communication apparatus according to an embodiment.

Below, a filter, multiplexer, and communication apparatus according to an embodiment of the present disclosure will be explained with reference to the drawings. Note that, the drawings used in the following explanation are schematic ones. Dimensions and ratios etc. in the drawings do not always match the actual ones.

In the filter, any direction may be defined as "upper" or "lower". In the following description, however, for convenience, an orthogonal coordinate system xyz will be defined, and sometimes use will be made of the "upper surface", "lower surface", and other terms while defining the positive side of the z-direction as the upper part. Note that, the orthogonal coordinate system xyz is defined based on the shape of the filter and does not designate the crystal axes of the piezoelectric substrate.

First Embodiment

<Communication Apparatus>

FIG. 1 is a block diagram showing a principal part of a communication apparatus 101 according to an embodiment of the present disclosure. The communication apparatus 101 performs wireless communication utilizing radio waves. The multiplexer 7 has the function of branching a signal having a transmission frequency and a signal having a reception frequency in the communication apparatus 101.

In the communication apparatus 101, a transmission information signal TIS containing the information to be transmitted is modulated and boosted up in frequency (conversion to a high frequency signal of a carrier frequency) by an RF-IC (Radio Frequency Integrated Circuit) 103 to obtain a transmission signal TS. The transmission signal TS is stripped of unnecessary components out of the transmission-use passband by a band pass filter 105, amplified by an amplifier 107, and input to the multiplexer 7. The multiplexer 7 strips the unnecessary components out of the transmission-use passband from the input transmission signal TS and outputs the result to an antenna 109. The antenna 109 converts the input electrical signal (transmission signal TS) to a wireless signal which it then transmits.

In the communication apparatus 101, the wireless signal received by the antenna 109 is converted to an electrical signal (reception signal RS) by the antenna 109 and is input to the multiplexer 7. The multiplexer 7 strips the unnecessary components out of the reception-use passband from the input reception signal RS and outputs the result to an amplifier 111. The output reception signal RS is amplified by the amplifier 111 and is stripped of unnecessary components out of the reception-use passband by a band pass filter 113. Further, the reception signal RS is boosted down in frequency and is demodulated by the RF-IC 103 to become a reception information signal RIS.

The transmission information signal TIS and reception information signal RIS may be low frequency signals (baseband signals) containing suitable information and are for example analog audio signals or digital audio signals. The passband of the wireless signal may be one according to the UMTS (Universal Mobile Telecommunications System) or other various standards. The modulation scheme may be phase modulation, amplitude modulation, frequency modulation, or a combination of any two or more among them.

<Multiplexer>

Figure 2:
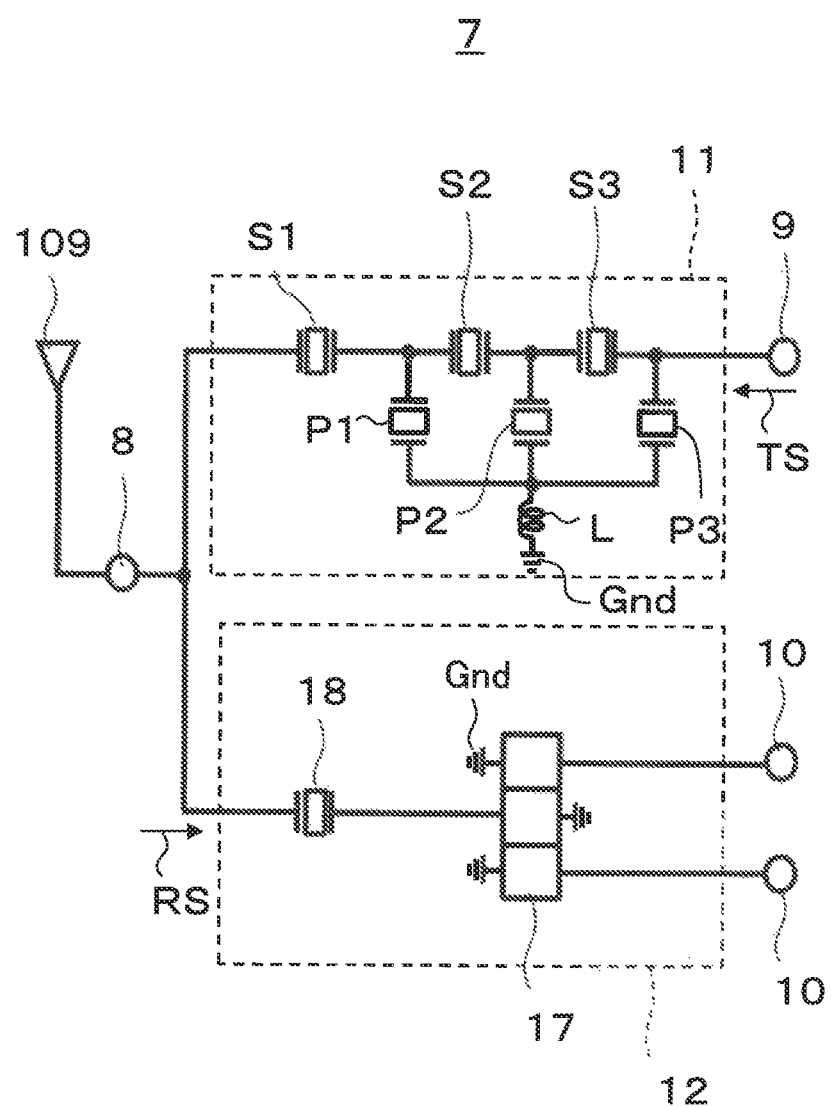
FIG. 2 is a circuit diagram of a multiplexer using a filter according to an embodiment.

FIG. 2 is a circuit diagram showing the configuration of the multiplexer 7 using a filter 1 according to an embodiment of the present disclosure. More specifically, it is a circuit diagram showing the multiplexer 7 and antenna 109. The portion other than the antenna is the multiplexer 7. The multiplexer 7 is a multiplexer used in the communication apparatus 101 in FIG. 1. The multiplexer 7 is provided with a first filter 11 and a second filter 12. This example shows a case of providing a transmission filter as the first filter 11 and providing a reception filter having a passband positioned on a higher frequency side than that of the transmission filter as the second filter 12. The filter configuring the first filter 11 and/or the second filter 12 is configured by resonators which are arranged on the piezoelectric substrate 2.

The filter 1 is for example the first filter 11 in the multiplexer 7 shown in FIG. 2. In the first filter 11, a ladder type filter circuit is configured by a plurality of SAW resonators. The first filter 11, as shown in FIG. 2, has a piezoelectric substrate 2 (not shown) and serial resonators S1 to S3 and parallel resonators P1 to P3 which are formed on the piezoelectric substrate 2.

The multiplexer 7 is provided with a first terminal 8, second terminal 9, and third terminals 10. In this example, the first terminal 8 functions as an antenna terminal, the second terminal 9 functions as a transmission terminal, and the third terminals 10 function as reception terminals. Further, the multiplexer 7 is mainly configured by the first filter 11 which is arranged between the first terminal 8 and the second terminal 9 and by the second filter 12 which is arranged between the first terminal 8 and the third terminals 10.

To the second terminal 9, the transmission signal TS from the amplifier 107 is input. The transmission signal TS input to the second terminal 9 is stripped of unnecessary components out of the transmission-use passband in the first filter 11 and is output to the first terminal 8. Further, the first terminal 8 receives as input the reception signal RS from the antenna 109. The signal is stripped of unnecessary components out of the reception-use passband in the second filter 12 and is output to the third terminals 10.

The first filter 11, in this example, is configured by a ladder type SAW filter. Here, "SAW" designates a surface acoustic wave. Specifically, the first filter 11 has three serial resonators S1, S2, and S3 which are connected in series between its input side and output side and three parallel resonators P1, P2, and P3 which are provided between serial arms which are lines for connecting the serial resonators to each other and a reference potential part Gnd. That is, the first filter 11 is a ladder type filter having three-stage structure. However, in the first filter 11, the ladder type filter may have any number of stages.

An inductor L is provided between the parallel resonators P1, P2, and P3 and the reference potential Gnd. By setting the inductance of this inductor L to a predetermined magnitude, the transmission characteristics of the transmission signal can be adjusted.

The second filter 12 for example has a multiplex mode type SAW filter 17 and an auxiliary resonator 18 which is connected in series to the input side of the same. Note that, in the present embodiment, "multiplex mode" includes a dual mode. The multiplex mode type SAW filter 17 has a balance-unbalance conversion function. The second filter 12 is connected to the two reception terminals 10 to which balanced signals are output. The second filter 12 is not limited to one configured by the multiplex mode type SAW filter 17 and may also be configured by a ladder type filter or may also be a filter which does not have a balance-unbalance conversion function.

Between the connection point of the first filter 11, second filter 12, and first terminal 8 and the reference potential Gnd, an impedance matching-use circuit configured by an inductor or the like may be inserted as well.

<Filter>

The filter 1 used for the first filter 11 configuring a ladder type filter will be explained. By using the filter 1, the attenuation can be made larger out of the passing frequency bandwidth of the transmission signal.

Figure 3:
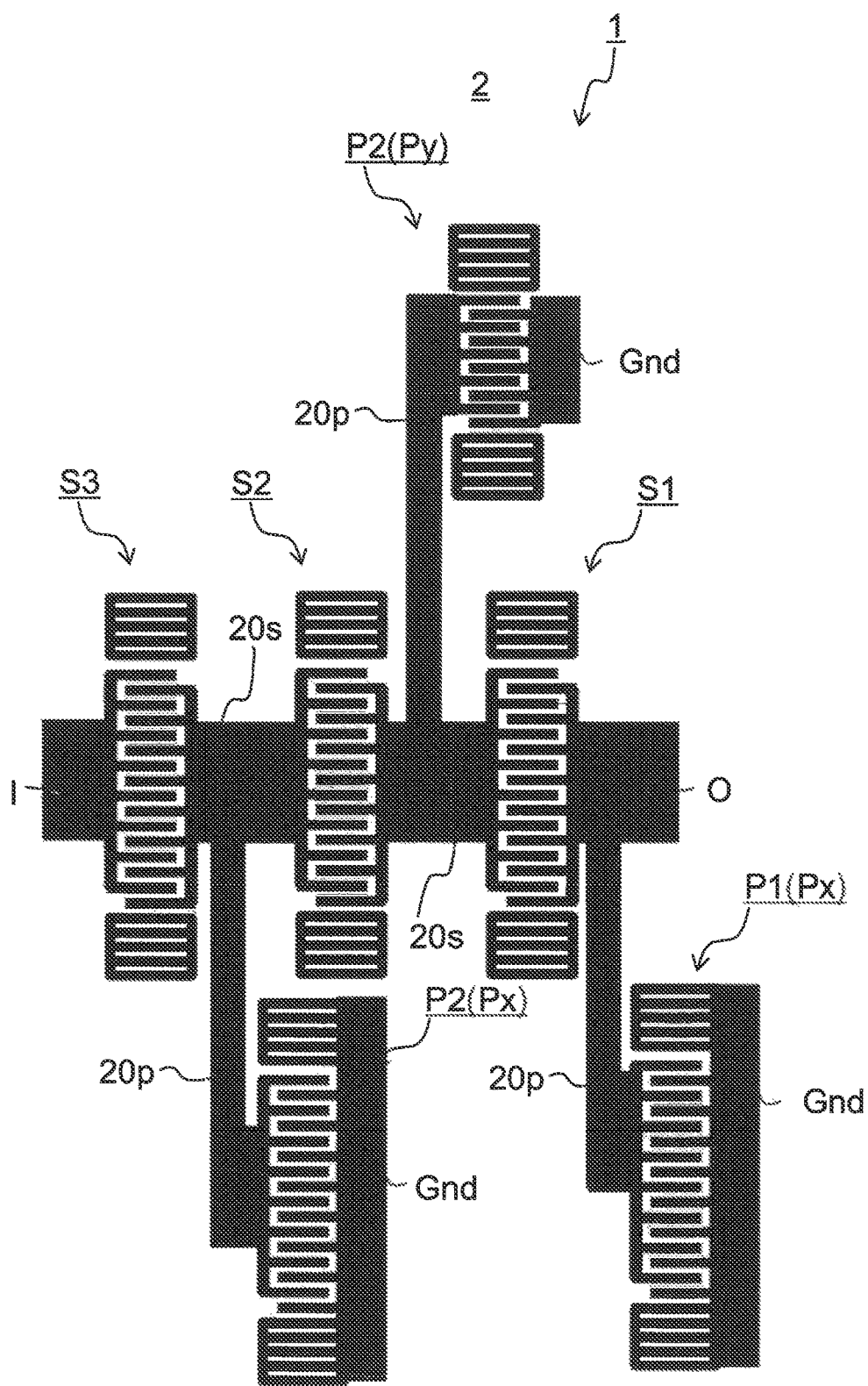
FIG. 3 is a plan view of a filter according to an embodiment.

FIG. 3 is a plan view showing the configuration of the filter 1 according to an embodiment of the present invention. FIG. 3 is a schematic view, therefore the numbers, pitch, duty, etc. of the electrode fingers 32 and strips 42 differ from the actual ones.

As shown in FIG. 3, the filter 1 is provided with a piezoelectric substrate 2, a plurality of serial resonators S1 to S3, and a plurality of parallel resonators P1 to P3. The serial resonators S1 to S3 and parallel resonators P1 to P3 are connected in a ladder type between the input port I and the output port O by lines 20. Specifically, the lines 20 includes a serial arms 20s which connect the serial resonators S1 to S3 in series and parallel arms 20p which connect the parallel resonators P1 to P3 between the serial arms 20s and the reference potential Gnd. Further, the input port I is electrically connected to the second terminal 9. The output port O is electrically connected to the first terminal 8.

Each of the serial resonators S1 to S3 and parallel resonators P1 to P3 is configured by an acoustic wave (SAW: Surface Acoustic Wave) element. Note that illustration of the outer edge of the piezoelectric substrate 2 is omitted.

Figure 4:
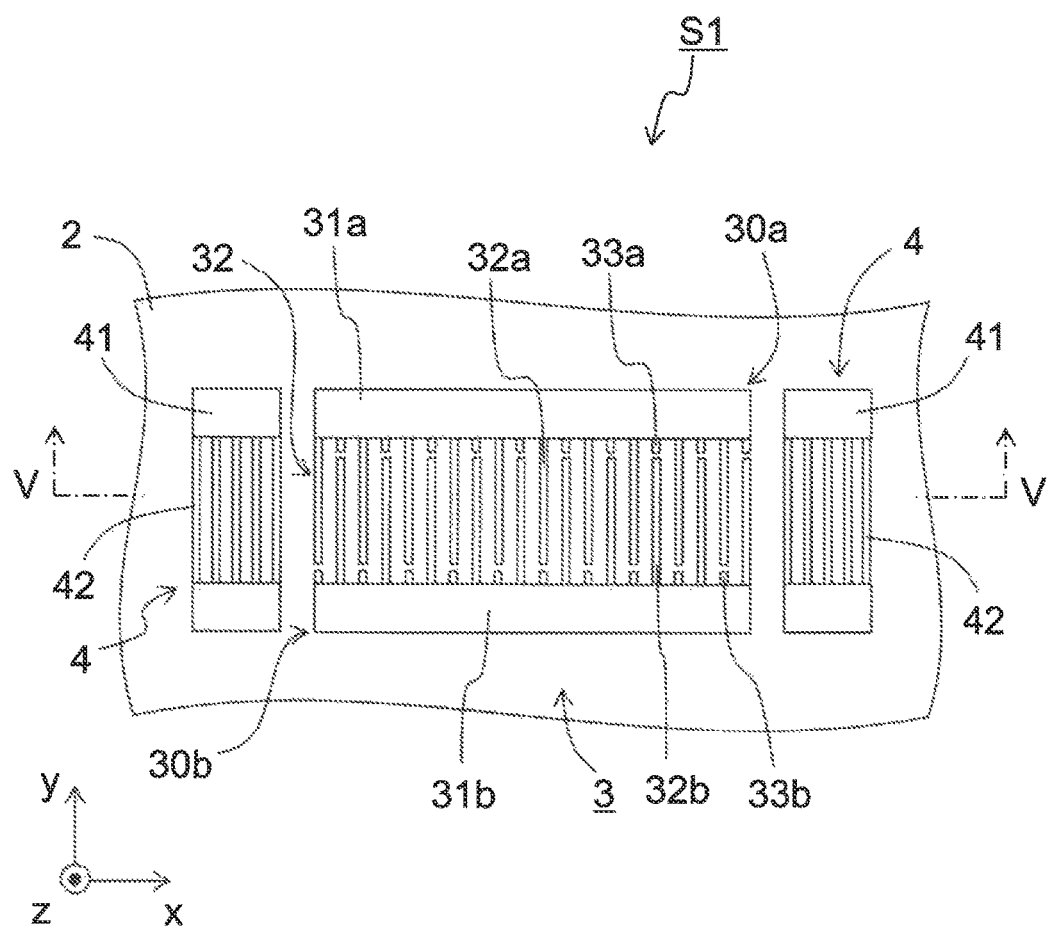
FIG. 4 is a plan view of an acoustic wave element configuring the filter.
Figure 5:
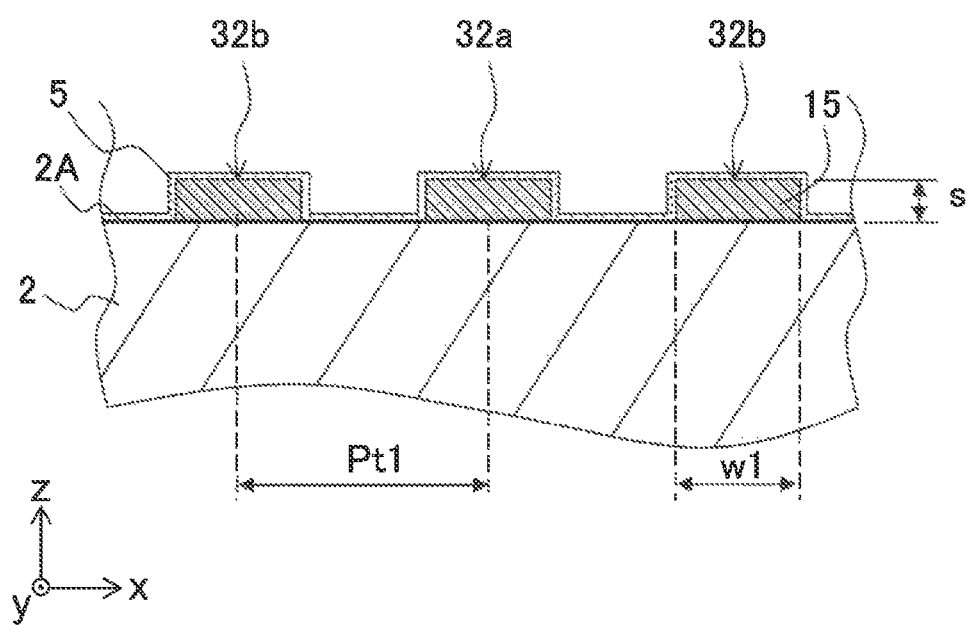
FIG. 5 is an enlarged view of a principal part of a cross-section cut along a V-V line in the acoustic wave element in FIG. 4.

FIG. 4 is a schematic plan view of for example an acoustic wave element configuring the serial resonator S1, while FIG. 5 is an enlarged cross-sectional view of a principal part taken along a V-V line in FIG. 4. The SAW element, as shown in FIG. 4 and FIG. 5, is provided with an IDT (Interdigital Transducer) electrode 3 provided on the upper surface 2A of the piezoelectric substrate 2. As shown in these figures, the SAW element may be provided with reflectors 4 as well.

The piezoelectric substrate 2 is configured by a substrate of a single crystal having piezoelectricity such as a lithium niobate ($LiNbO_3$) crystal or lithium tantalate ($LiTaO_3$) crystal. Specifically, for example, the piezoelectric substrate 2 is configured by a 36° to 48° Y-X cut $LiTaO_3$ substrate. The planar shape and various dimensions of the piezoelectric substrate 2 may be suitably set. As an example, the thickness (z-direction) of the piezoelectric substrate 2 is 0.2 mm or more and 0.5 mm or less.

The IDT electrode 3, as shown in FIG. 4, has a first comb-shaped electrode 30a and a second comb-shaped electrode 30b. Note that, in the following explanation, sometimes the first comb-shaped electrode 30a and the second comb-shaped electrode 30b will be referred to as the comb-shaped electrodes 30 and will not be differentiated. Further, the first comb-shaped electrode 30a and the second comb-shaped electrode 30b are connected to potentials which are different from each other.

The comb-shaped electrodes 30, as shown in FIG. 4, have two bus bars 31 which face each other and pluralities of electrode fingers 32 which extend from the bus bars 31 to the other bus bars 31. Further, the comb-shaped electrodes 30 are arranged so that the first electrode fingers 32a and the second electrode fingers 32b mesh (cross) with each other in the propagation direction of the acoustic wave. That is, the first electrode fingers 32a and the second electrode fingers 32b are alternately arranged.

Further, the comb-shaped electrodes 30 have dummy electrode fingers 33 which face the opposing electrode fingers 32. First dummy electrode fingers 33a extend from the first bus bar 31a toward the second electrode fingers 32b. Second dummy electrode fingers 33b extend from the second bus bar 31b toward the first electrode fingers 32a. Note that, the dummy electrode fingers 33 need not be arranged.

The bus bars 31 are for example formed in substantially long shapes linearly extending with constant widths. Accordingly, edge parts of the bus bars 31 which face each other form straight lines. The pluralities of electrode fingers 32 are for example formed in substantially long shapes linearly extending with constant widths and are arranged at substantially constant intervals in the propagation direction of the acoustic wave.

The pluralities of electrode fingers 32 of the pair of comb-shaped electrodes 30 configuring the IDT electrode 3 are set so as to have a pitch Pt1. The pitch Pt1 is for example set so as to become equal to the half-wavelength of the wavelength λ of the acoustic wave at the frequency to be resonated at. The wavelength λ (2×Pt1) is for example 1.5 μm to 6 μm. In the IDT electrode 3, most of the pluralities of electrode fingers 32 is arranged so as to have the pitch Pt1, whereby the pluralities of electrode fingers 32 become arranged at a constant period, therefore an acoustic wave can be efficiently generated.

Here, the pitch Pt1, in the propagation direction, designates the interval from a center of a first electrode finger 32a to a center of a second electrode finger 32b which is adjacent to this first electrode finger 32a. In each electrode finger 32, the width w1 in the propagation direction of the acoustic wave is suitably set in accordance with the electrical characteristics etc. demanded from the SAW element. The width w1 of the electrode finger 32 is for example 0.3 to 0.7 time the pitch Pt1.

By arranging the electrode fingers 32 in this way, an acoustic wave which propagates in a direction perpendicular to the pluralities of electrode fingers 32 is generated. Accordingly, after considering the crystal orientation of the piezoelectric substrate 2, the two bus bars 31 are arranged so as to face each other in a direction crossing the direction in which the acoustic wave is to be propagated. The pluralities of electrode fingers 32 are formed so as to extend in the direction perpendicular to the direction in which the acoustic wave is to be propagated. Note that, the propagation direction of the acoustic wave is defined by the orientation of the pluralities of electrode fingers 32 and so on. However, in the present embodiment, as a matter of convenience, sometimes the orientation of the pluralities of electrode fingers 32 etc. will be explained using the propagation direction of the acoustic wave as the standard.

The numbers of the electrode fingers 32 (first electrode fingers 32a and second electrode fingers 32b) are 50 to 350 per side.

The lengths of the pluralities of electrode fingers 32 (lengths from the bus bars to the front ends) are for example set to substantially the same lengths. The length of meshing (crossing width) of the electrode fingers 32 facing each other is 10 to 300 μm. Note that, the lengths and crossing widths of the electrode fingers 32 may be changed. For example, they may be made longer or shorter along the propagation direction as well. Specifically, by changing the lengths of the electrode fingers 32 relative to the propagation direction, an apodized IDT electrode 3 may be configured as well. In this case, spurious emission of the lateral mode can be reduced or the power handling property can be improved.

The IDT electrode 3 may be directly arranged on the upper surface 2A of the piezoelectric substrate 2 or may be arranged on the upper surface 2A of the piezoelectric substrate 2 through an underlying layer formed by another member. The other member is for example made of Ti, Cr, or an alloy of the same. When the IDT electrode 3 is arranged through an underlying layer on the upper surface 2A of the piezoelectric substrate 2, the thickness of the other member is set to an extent where almost no influence is exerted upon the electrical characteristics of the IDT electrode 3 (for example a thickness of 5% of the thickness of the IDT electrode 3 in the case of Ti).

Further, on the electrode fingers 32 configuring the IDT electrode 3, in order to improve the temperature characteristics of the SAW element 1, a mass-addition film may be laminated as well. As the mass-addition film, for example use can be made of $SiO_2$.

When a voltage is applied, the IDT electrode 3 excites an acoustic wave which propagates in the x-direction in the vicinity of the upper surface 2A of the piezoelectric substrate 2. The excited acoustic wave is reflected at a boundary of electrode fingers 32 with a non-arrangement area (long shaped region between adjoining electrode fingers 32). Further, a standing wave having the pitch Pt1 of the electrode fingers 32 as a half-wavelength is formed. The standing wave is converted to an electrical signal having the same frequency as that of the standing wave and is extracted by the electrode fingers 32. In this way, the SAW element 1 functions as a single-port resonator.

The reflectors 4 are arranged so as to sandwich the IDT electrode 3 in the propagation direction of the acoustic wave. Each reflector 4 is formed by substantially strip shapes. That is, the reflector 4 has reflector bus bars 41 which face each other in a direction crossing the propagation direction of the acoustic wave and a plurality of strips 42 (also referred to as the reflection electrode fingers 42) which extend in the direction perpendicular to the propagation direction of the acoustic wave between these bus bars 41. The reflector bus bars 41 are for example formed in substantially long shapes linearly extending with constant widths and are arranged parallel in the propagation direction of the acoustic wave.

The plurality of reflection electrode fingers 42 are arranged at a pitch Pt2 for reflecting the acoustic wave excited in the IDT electrode 3. When setting the pitch Pt1 of the IDT electrode 3 to the half-wavelength of the wavelength λ of the acoustic wave, the pitch Pt2 may be set to the same extent as the pitch Pt1. The wavelength λ (2×Pt2) is for example 1.5 μm to 6 μm. Here, the pitch Pt2 designates the interval from a center of a reflection electrode finger 42 to a center of an adjacent reflection electrode finger 42 in the propagation direction. The number of reflection electrode fingers 42 may be set to for example about 20 to 30.

Further, the plurality of reflection electrode fingers 42 are formed in substantially long shapes linearly extending with constant widths. The width of a reflection electrode finger 42 can be set to for example be substantially equal to the width w1 of an electrode finger 32. The reflectors 4 are for example formed by the same material as the IDT electrode 3 and are formed to a thickness equal to the IDT electrode 3.

The reflectors 4 are arranged at intervals with respect to the IDT electrode 3. Here, an "interval" designates the interval from a center of the electrode finger 32 in the IDT electrode 3 which is positioned at an end part on the reflector 4 side up to a center of the reflection electrode finger 42 in the reflector 4 which is positioned at an end part on the IDT electrode 32 side. The interval is usually set so as to become the same as the pitch Pt1 (or Pt2) of the electrode fingers 32 in the IDT electrode 3.

A protective layer 5, as shown in FIG. 5, is provided on the piezoelectric substrate 2 so as to cover the tops of the IDT electrode 3 and reflectors 4. Specifically, the protective layer 5 covers the surfaces of the IDT electrode 3 and the reflectors 4 and covers the portions at the upper surface 2A of the piezoelectric substrate 2 which are exposed from the IDT electrode 3 and reflectors 4. The thickness of the protective layer 5 is for example 1 nm to 800 nm.

The protective layer 5 is formed by a material having an insulation property and contributes to the protection from corrosion etc. Preferably, the protective layer 5 is formed by $SiO_2$ or another material due to which the propagation speed of the acoustic wave becomes faster when the temperature rises. Due to this, change of the electrical characteristics along with change of the temperature of the acoustic wave element 1 can be kept small as well. Further, when the protective layer 5 is configured by $SiN_x$, it is excellent in humidity resistance, therefore an acoustic wave element 1 having high reliability can be provided.

The example shown in FIG. 4 and FIG. 5 was explained using the serial resonator S1 as an example. However, the other serial resonators S2 and S3 can be given the same configuration as well after suitably adjusting the design of the number or pitch of the electrode fingers and so on.

The parallel resonators P1 to P3 basically have the same configuration as the SAW element shown in FIG. 4 and FIG. 5. However, they differ from the serial resonators S1 to S3 in the following points.

First, at least one of the parallel resonators P1 to P3 is defined as a first parallel resonator Px, and at least one is defined as a second parallel resonator Py. The first parallel resonator Px has a lower resonance frequency than the resonance frequency of the serial resonators S1 to S3. That is, the first parallel resonator Px forms the passband of the filter 1 by making the resonance frequency of the serial resonators S1 to S3 and the antiresonance frequency of the first parallel resonator Px substantially match. In this example, the parallel resonators P1 and P3 are defined as first parallel resonators Px.

The second parallel resonator Py has a higher resonance frequency than the antiresonance frequency of the serial resonators S1 to S3. In this example, the parallel resonator P2 is defined as the second parallel resonator Py.

Note that, the serial resonators which are used for the comparison of the resonance frequencies of a first parallel resonator Px and second parallel resonator Py are made all of the resonators having resonance frequencies positioned in the passband to which the present filter is applied. In other words, even when arranged on the serial arms 20s, a resonator that has a resonance frequency outside of the passband is differentiated from the serial resonators in the present example and is excluded from the comparison.

The resonance frequencies and antiresonance frequencies of the parallel resonators P1 to P3 (Px, Py) can be adjusted according to for example the pitch of the electrode fingers 32.

The filter 1 is provided with the parallel resonators P1 to P3 (Px, Py) as explained above. Due to this, attenuation out of the passband of the filter 1 can be made larger. That is, attenuation can be made larger in a region where the baseline of the attenuation rises the further from the passband toward a high frequency side.

When there is a passband of another filter (for example the second filter 12) on a high frequency side of the passband, it is necessary to set the attenuation area in order to raise the isolation and to make the attenuation in the attenuation area reach a sufficient level. Contrary to this, according to the filter 1 in the present embodiment, the resonance frequency of the second parallel resonator Py is positioned on a high frequency side out of the passband of the filter 1. At the resonance frequency, the impedance becomes the smallest, therefore a signal can easily flow to the second parallel resonator Py side, while a signal flows with difficulty to the transmission side. Due to this, the attenuation in the attenuation area can be raised. Here, the attenuation is determined by the impedance level in the vicinity of the attenuation pole, therefore it is not always necessary to position the resonance frequency of the second parallel resonator Py in the passband of the second filter 12, but it may be positioned in the passband of the second filter 12 as well.

In the same way, the attenuation is determined by the impedance level in the vicinity of the attenuation pole, therefore it is not always necessary to position the resonance frequency of the second parallel resonator Py out of the passband of the first filter 11, but it may be positioned outside of the passband of the first filter 11 as well.

As explained above, the attenuation characteristics are improved in the vicinity of the resonance frequency of the second parallel resonator Py, while the attenuation characteristics are liable to become degraded in the vicinity of the antiresonance frequency of the second parallel resonator Py. Further, insertion loss of the filter 1 positioned at the resonance frequency or less of the second parallel resonator Py is liable to become worse. In the example shown in FIG. 3, the electrostatic capacity of this second parallel resonator Py is made sufficiently smaller compared with the other parallel resonators (P1, P3). Specifically, the number of electrode fingers 32 is made smaller and the crossing width is made smaller. In further detail, the electrostatic capacity is controlled to not more than ⅓ of that of the first parallel resonator Px. The larger the capacity of the resonator, the smaller the impedance throughout all frequencies. For this reason, signals within the passband also flow through the second parallel resonator Py to the ground side, therefore the loss becomes larger. Contrary to this, by making the capacity of the second parallel resonator Py smaller, the impedance of the second parallel resonator Py becomes larger, therefore the loss in the vicinity of the antiresonance frequency becomes larger, so degradation of attenuation characteristics can be suppressed. Further, by the impedance at the resonance frequency or less being made larger, influence of the filter 1 exerted upon the insertion loss can be suppressed. Further, when the capacity of the second parallel resonator Py is controlled to 10% or less relative to another usual resonator, loss can be further suppressed.

Note that, sometimes the impedance matching in the passband of the filter 1 becomes off due to the second parallel resonator Py, therefore the frequency pitch and electrostatic capacity of the other resonators are adjusted together.

Further, in the example shown in FIG. 3, the reflectors 4 in the serial resonators S1 to S3 are formed as floating electrodes. In other words, the reflectors 4 in the serial resonator S1 to S3 are given floating potentials. Due to this, a phase difference between an incident wave and a reflection wave can be reduced to approximately 0°, and the resonance characteristics can be improved. Due to this, the insertion loss of the filter can be reduced.

On the other hand, the reflectors 4 in the parallel resonators P1 and P3 are electrically connected by the second bus bar 31b in the second comb-shaped electrode 30b on the side connected to the reference potential and the reflectors 4 being continuously integrally formed. Due to this, the reflectors 4 in the parallel resonators P1 and P3 are connected to the reference potential. By employing such a configuration, in the parallel resonators P1 and P3 (first parallel resonators Px), the phase difference between the incident wave and the reflection wave of the SAW can be controlled to approximately 180°, so can be cancelled by each other. Due to this, the antiresonance characteristics can be improved, therefore the loss at the center of the passband of the filter 1 can be reduced. Further, the reflectors 4 in the parallel resonators P have the same potential as that of the second comb-shaped electrode 30b, therefore the reflectors 4 can be utilized as the line for connection to the reference potential Gnd (ground potential in this example) as well. Due to this, a degree of freedom for layout of the line rises, therefore it can contribute to reduction of size. Further, the width of the line connected to the reference potential can be broadened, therefore the loss can be made smaller by making the electrical resistance smaller.

Note that, among the parallel resonators P, the reflectors 4 in the second parallel resonator Py (P2) can be formed as floating electrodes as well. Specifically, in the second parallel resonator Py (P2), the second bus bar 31b in the second comb-shaped electrode 30b and the reflectors 4 are separated and are not electrically connected.

In this case, in the second parallel resonator Py, the phase difference between the incident wave and the reflection wave can be controlled to approximately 0°, therefore the resonance characteristics can be improved. Due to this, the impedance of the second parallel resonator Py becomes smaller, and the signal flows through the second parallel resonator Py to the ground side, therefore the attenuation in the vicinity of the resonance frequency can be further increased. Note that, in this example, the reflectors 4 in the first parallel resonators Px were connected to the reference potential, but the reflectors 4 in all of the parallel resonators P can be formed as floating electrodes as well.

Figure 16:
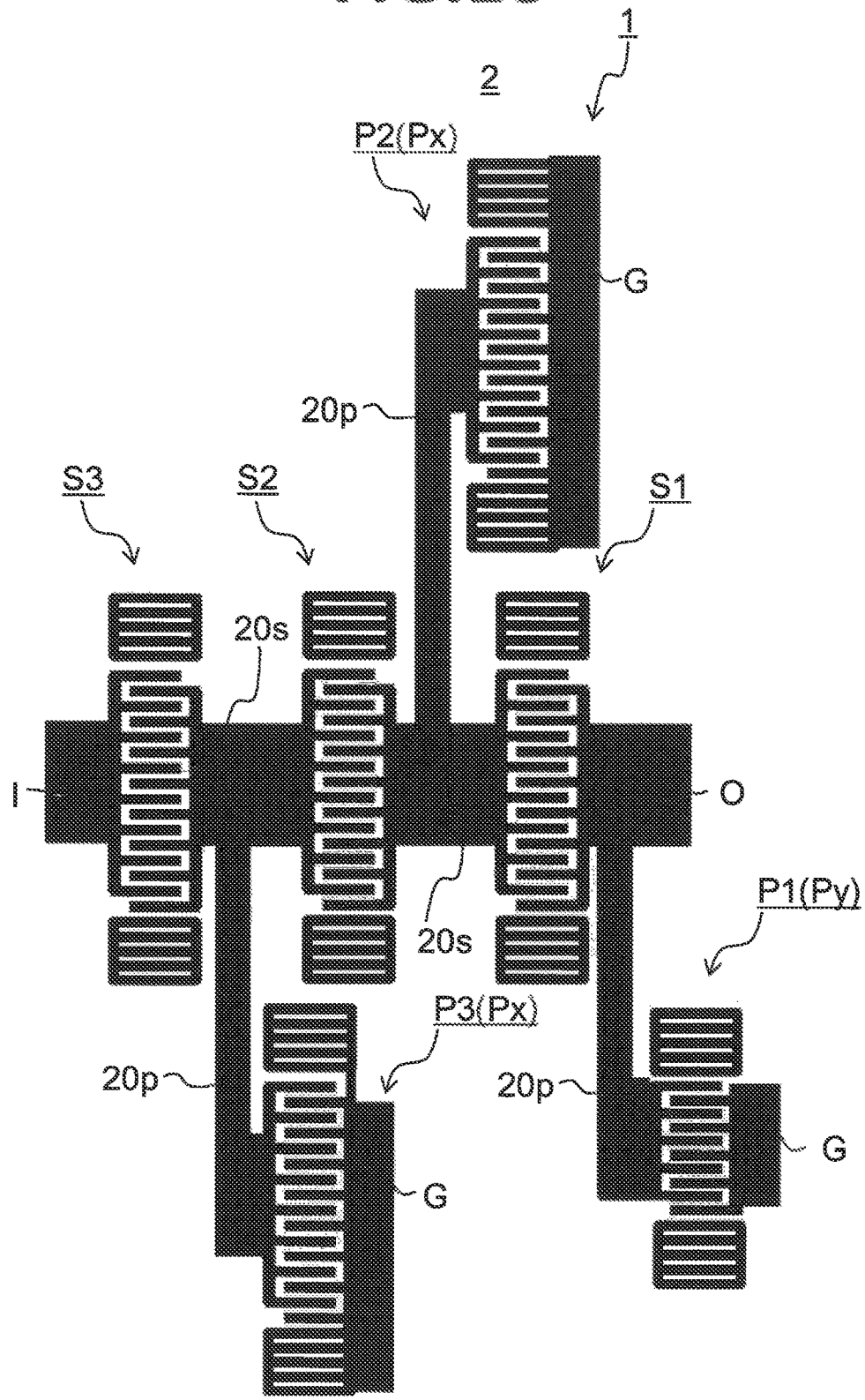
FIG. 16 is a plan view of a filter according to another embodiment.

Note that, in the example shown in FIG. 3, among the parallel resonators P1 to P3, the resonator on the side nearest the output port O was defined as the first parallel resonator Px. In a case where the output port O is connected to the first terminal 8 which functions as the antenna terminal, in order to match impedance with the antenna 109, the second parallel resonator Py, which is designed much different from the other parallel resonators, may be located far away as well. Further, as shown in FIG. 16, among the parallel resonators P1 to P3, the resonator on the side nearest the output port O may be defined as the second parallel resonator Py as well. Further, the number of the first parallel resonators Px may be one, two, or more. In the same way, the number of the second parallel resonators Py may be one, two, or more. When a plurality of second parallel resonators Py are provided, there are the effects that the bandwidth for attenuation can be broadened or a plurality of bandwidths for attenuation can be provided. The design of each second parallel resonator Py at that time may be changed so as to match with the desired frequency band and attenuation as well.

Further, the reflectors 4 in the serial resonators S1 to S3 and parallel resonators P1 to P3 are not limited to the connection relationships explained above. For example, the reflectors 4 in the serial resonators S1 to S3 may be connected to the reference potential as well.

Second Embodiment

In the first embodiment, the explanation was given with reference to an example in which the second parallel resonator Py was designed based on a design concept different from the first parallel resonator Px in only the resonance frequency and electrostatic capacity. However, the reflectors 4 may be made different as well. Specifically, the reflectors 4 in the first parallel resonator Px are formed by connecting the strips 42 by the reflector bus bars 41, but the reflectors 4 in the second parallel resonator Py may be configured as open types without reflector bus bars 41 as well. Below, only the portions different from the first embodiment will be explained: overlapping explanations will be omitted.

Figure 6:
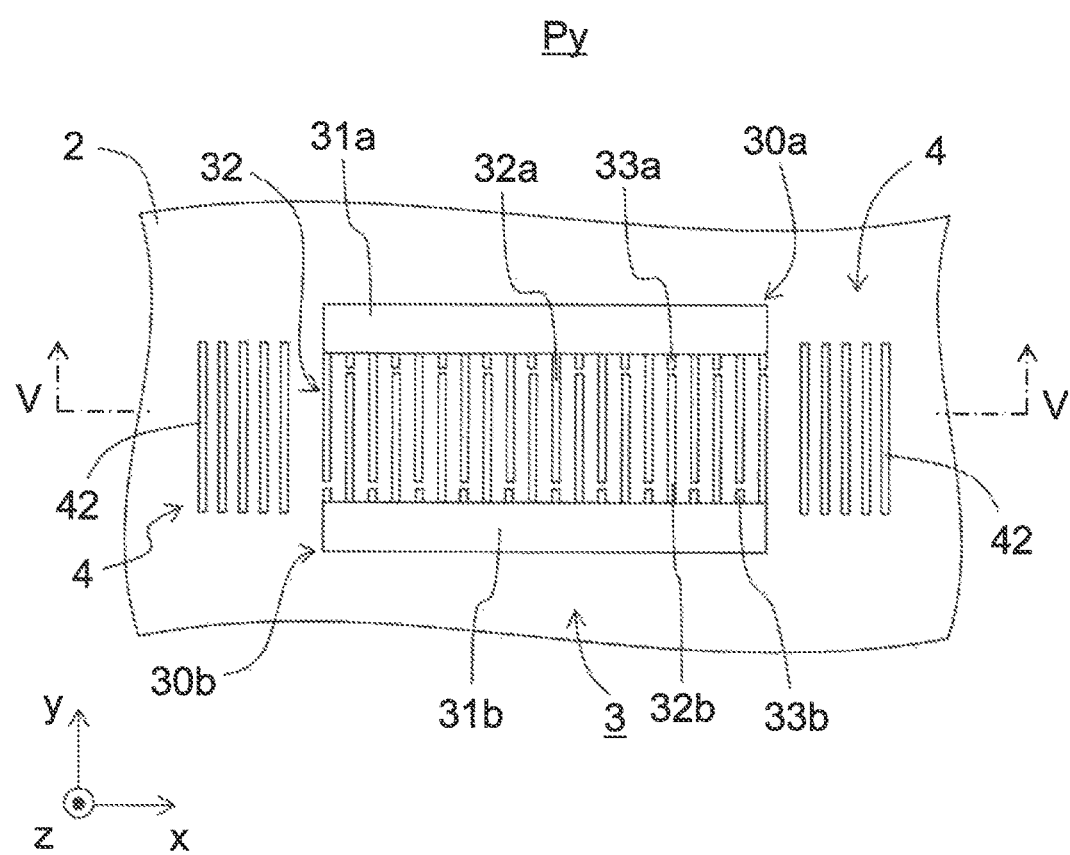
FIG. 6 is a schematic view of a second parallel resonator in another embodiment.

FIG. 6 is a schematic top view of a second parallel resonator Py which is used in the filter 1 according to the present embodiment. In FIG. 6, the reflectors 4 are configured by pluralities of reflection electrode fingers 42. The reflection electrode fingers 42 are not connected to each other, so the reflectors are open types.

By forming the reflectors 4 as open types in this way, the reflection efficiency of the resonator falls and the Q-value falls, therefore an impedance Z at the antiresonance frequency falls. Due to this, even in the vicinity of the antiresonance frequency, the signal can easily flow to the second parallel resonator Py side, therefore the attenuation at the frequency of the antiresonance frequency can be raised. That is, it is important to form a resonator having a small impedance at the antiresonance frequency by forming the reflectors 4 as open types.

Third Embodiment

Figure 14:
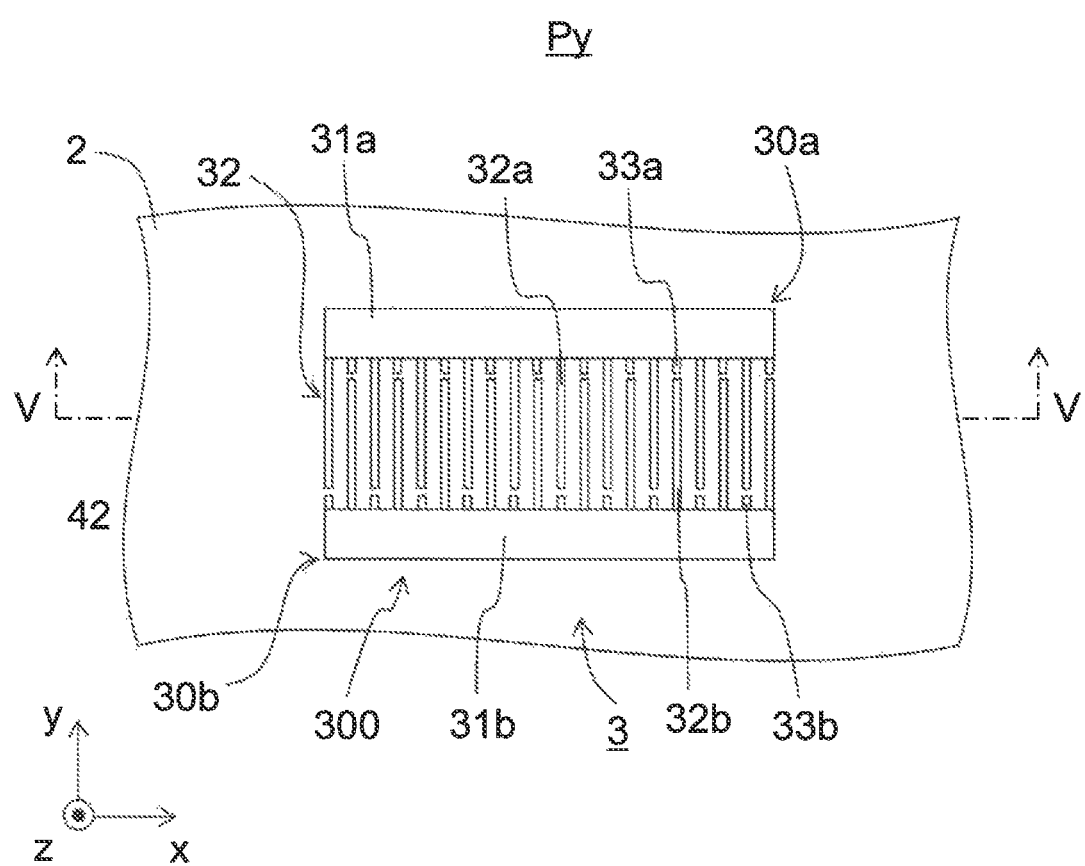
FIG. 14 is a schematic view of a second parallel resonator in another embodiment.

In the first embodiment, the explanation was given with reference to an example in which the second parallel resonator Py was designed based on a design concept different from the first parallel resonator Px in only the resonance frequency and electrostatic capacity. However, as shown in FIG. 14, a resonator which does not include the reflectors 4 and is provided with only the IDT electrode 3 may be employed as well. Below, only the portions different from the first embodiment will be explained: overlapping explanations will be omitted.

FIG. 14 is a top view showing a second parallel resonator Py in the present embodiment. By eliminating the reflectors 4 in the second parallel resonator Py, the reflection efficiency of the resonator falls and the Q-value falls, therefore the impedance Z at the antiresonance frequency falls. Due to this, even in the vicinity of the antiresonance frequency, the signal can easily flow to the second parallel resonator Py side, therefore the attenuation at the frequency of the antiresonance frequency can be raised. That is, it is important to form a resonator having a small impedance at the antiresonance frequency by eliminating the reflectors 4.

Fourth Embodiment

Figure 15:
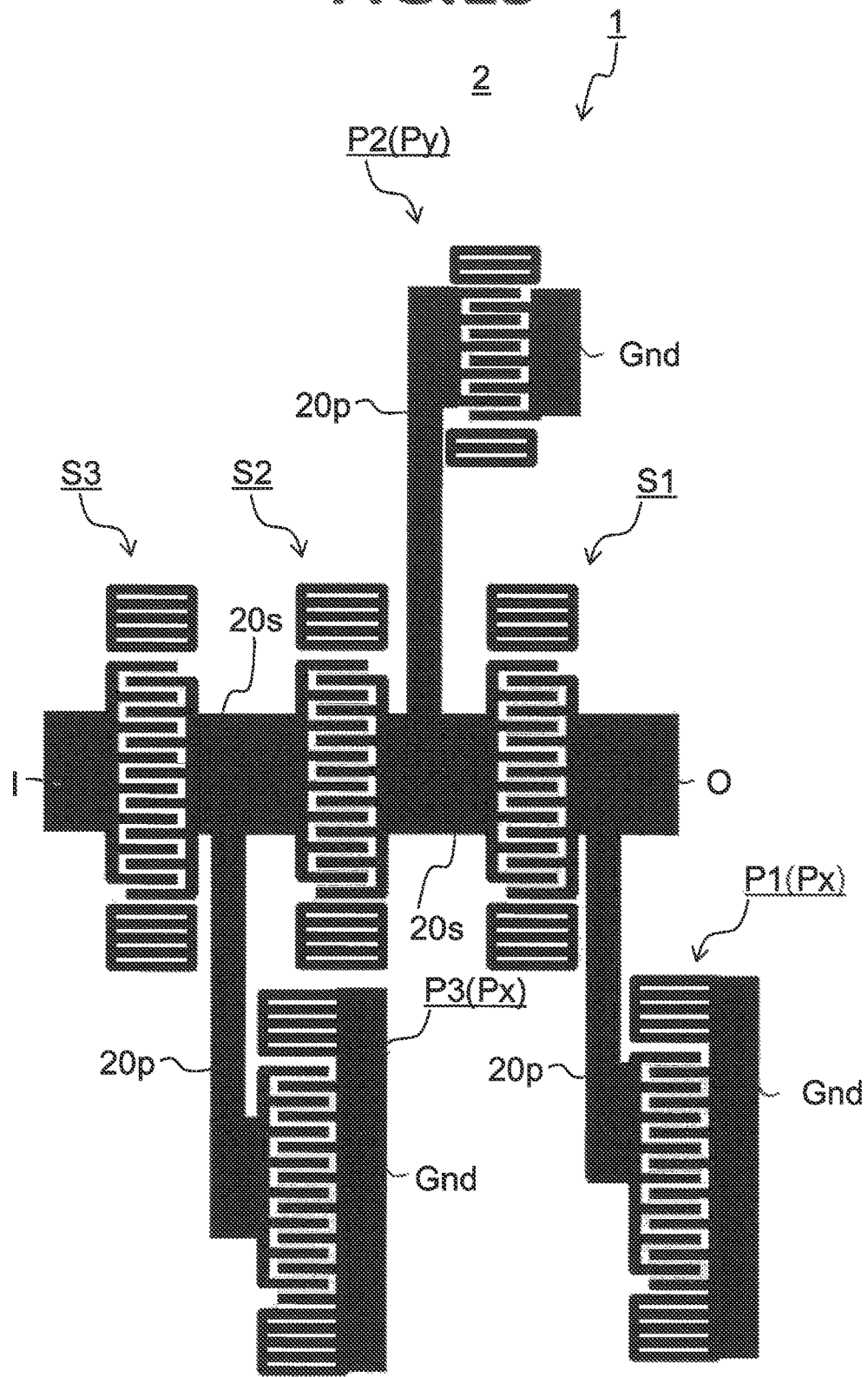
FIG. 15 is a plan view of a filter according to another embodiment.

In the first embodiment, the explanation was given with reference to an example in which the second parallel resonator Py was designed based on a design concept different from the first parallel resonator Px in only the resonance frequency and electrostatic capacity. However, as shown in FIG. 15, a resonator decreasing the reflection electrode fingers 42 in the reflector 4 may be employed as well. Below, only the portions different from the first embodiment will be explained: overlapping explanations will be omitted.

FIG. 15 is a top view of the filter 1 according to the present embodiment. The numbers of strips 42 in the reflectors 4 in the second parallel resonator Py become smaller than the numbers of strips 42 in the reflectors 4 in the first parallel resonator Px.

Usually, the numbers of reflection electrode fingers 42 in the reflectors 4 required for reducing the loss are determined according to the frequency of the input signal. For example, in a high band of 1.8 GHz or more, usually about 30 reflection electrode fingers 42 are necessary. For example, in a low band of 800 MHz, usually about 20 reflection electrode fingers 42 become necessary. In any case, if the numbers of reflection electrode fingers 42 become about halves of the required numbers, the loss of the resonator becomes conspicuous. Contrary to this, the reflectors 4 in the second parallel resonator Py are given numbers of reflection electrode fingers 42 of not more than the halves of the usually designed numbers of reflection electrode fingers 42.

In other words, the numbers of the reflection electrode fingers 42 in the second parallel resonator Py become smaller than the numbers of the reflection electrode fingers 42 in the first parallel resonator Px.

By decreasing the numbers of the reflection electrode fingers 42 in the reflectors 4 in the second parallel resonator Py, the reflection efficiency of the resonator falls and the Q-value falls, therefore the impedance Z at the antiresonance frequency falls. Due to this, even in the vicinity of the antiresonance frequency, the signal can easily flow to the second parallel resonator Py side, therefore the attenuation at the frequency of the antiresonance frequency can be raised. That is, it is important to form a resonator having a small impedance at the antiresonance frequency by decreasing the numbers of the reflection electrode fingers 42 in the reflectors 4.

Fifth Embodiment

In the first embodiment, the explanation was given with reference to an example in which the second parallel resonator Py was designed based on a design concept different from the first parallel resonator Px in only the resonance frequency and electrostatic capacity. However, the shape of the IDT electrode 3 may be made different as well. Specifically, the second parallel resonator Py may be formed as a slanted resonator. Below, only the portions different from the first embodiment will be explained: overlapping explanations will be omitted.

Figure 7:
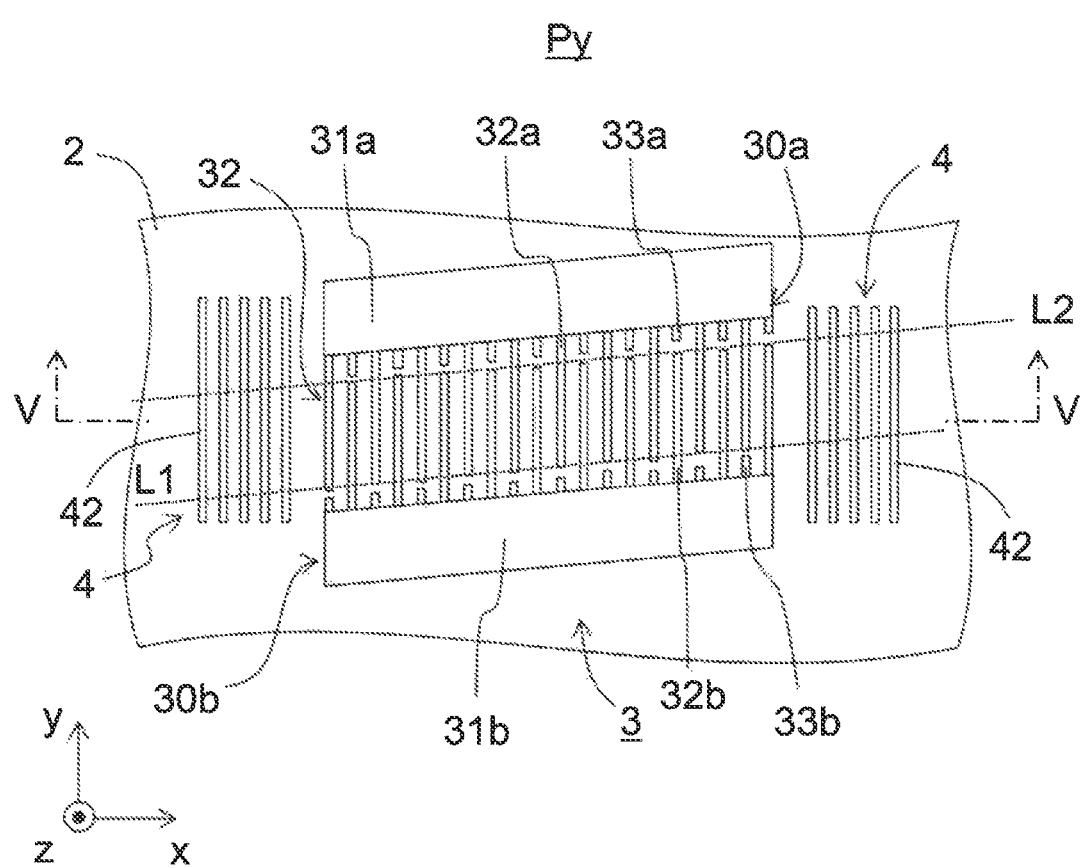
FIG. 7 is a schematic view of a second parallel resonator in another embodiment.

FIG. 7 is a schematic top view of a second parallel resonator Py used in the filter 1 according to the present embodiment. In FIG. 7, directions of extension of a first bus bar 31a and second bus bar 31b are inclined relative to the propagation direction of the acoustic wave. In other words, a virtual line (L1) connecting the front ends of the first electrode fingers 32a is inclined relative to the propagation direction of the acoustic wave. In the same way, also a virtual line (L2) connecting the front ends of the second electrode fingers 32b is inclined relative to the propagation direction of the acoustic wave. The inclination angle may be suitably designed within a range which exceeds 2°, but is not more than 10°. Also, the reflectors 4 may have the same inclination angle. The virtual line L1 and the virtual line L2 become substantially parallel.

By the resonator becoming slanted in this way, the electro-mechanical coupling coefficient of the resonator fall, therefore the impedance Z at the antiresonance frequency falls. Due to this, even in the vicinity of the antiresonance frequency, the signal can easily flow to the second parallel resonator Py side, therefore the attenuation at the frequency of the antiresonance frequency can be raised. That is, it is important to form a resonator having a small impedance at the antiresonance frequency by the resonator being formed slanted.

Sixth Embodiment

In the first embodiment, the explanation was given with reference to an example in which the second parallel resonator Py was designed based on a design concept different from the first parallel resonator Px in only the resonance frequency and electrostatic capacity. However, a portion of the IDT electrode 3 may be thinned out as well. Below, only the portions different from the first embodiment will be explained: overlapping explanations will be omitted.

Figure 8:
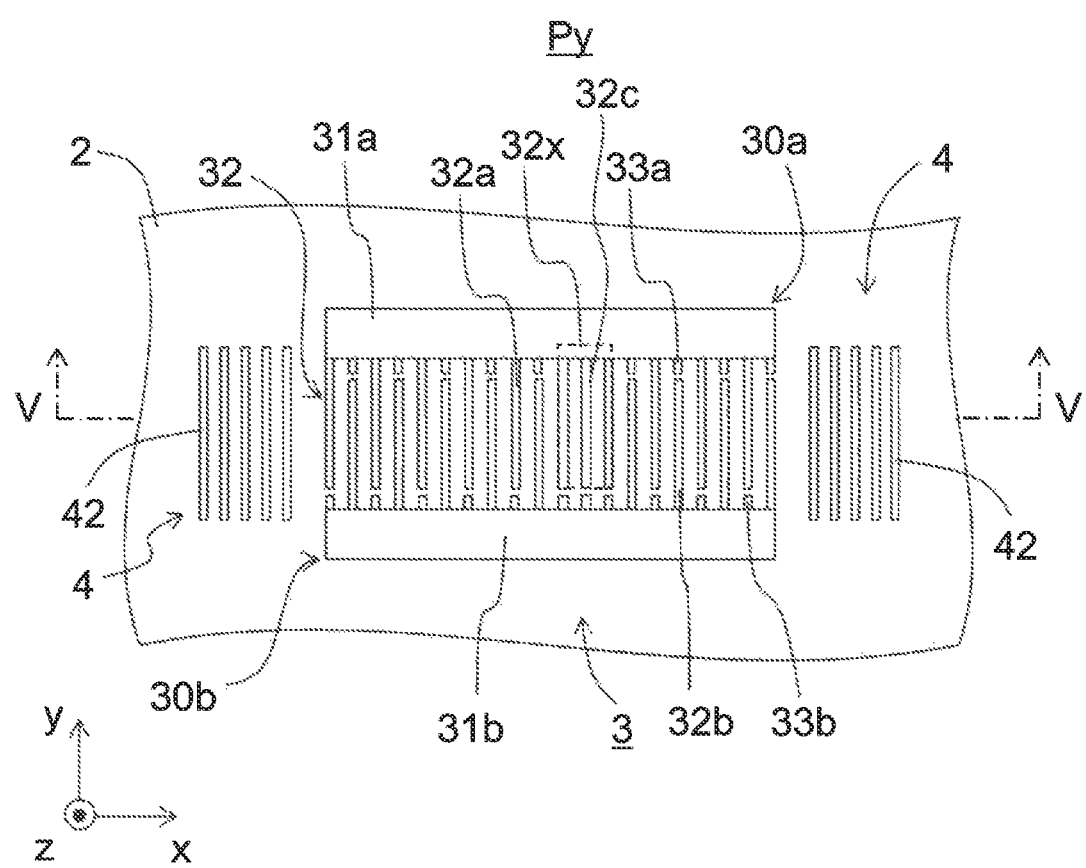
FIG. 8 is a schematic view of a second parallel resonator in another embodiment.

FIG. 8 is a schematic top view of the second parallel resonator Py formed by thinning out a portion of the IDT electrode 3 and used in the filter 1 according to the present embodiment. In FIG. 8, in the IDT electrode 3, the first electrode fingers 32a and the second electrode fingers 32b are usually alternately arranged. However, at part of this, the same electrode fingers 32 are arranged side by side (for example the first electrode fingers 32a are consecutively arranged or the second electrode fingers 32b are consecutively arranged). Such electrode fingers that are arranged side by side among electrode fingers 32 connected to the same potential will be referred to as "adjacent electrode fingers 32c". As in a region 32x indicated by a broken line in FIG. 8, one electrode finger 32 (for example second electrode finger 32b) may not be positioned at the part at which it should be positioned, and the other electrode fingers which exist on the two sides thereof (for example first electrode fingers 32a) may be integrally formed to become a wide electrode finger. This wide electrode finger becomes broad enough to cover a region in which three, five, or another odd number of electrode fingers are arranged.

In this way, by thinning out a portion of the IDT electrode 3, the impedance Z at the antiresonance frequency falls. Due to this, even in the vicinity of the antiresonance frequency, the signal can easily flow to the second parallel resonator Py side, therefore the attenuation at the frequency of the antiresonance frequency can be raised. That is, it is important to form a resonator having a small impedance at the antiresonance frequency by thinning out a portion of the IDT electrode 3.

Note that, all of the second to sixth embodiments explained above show configurations for making the impedance of the second parallel resonator Py smaller at the antiresonance frequency. They may be suitably combined as well. For example, the reflectors 4 may be formed as open types, and the IDT electrode 3 may be formed slanted.

In the above embodiments explained above, the impedance at the resonance frequency does not greatly change. Therefore, in any case, it is possible to obtain the effect of improvement of the attenuation characteristics in the vicinity of the resonance frequency. However, little change in impedance is seen, therefore the embodiments can be suitably combined according to the demanded characteristics. For example, in a case where a first attenuation area is in the vicinity of the high frequency side of the filter 1, and another second attenuation area is also in the vicinity of the high frequency side of that attenuation area, desirably the impedance of the second parallel resonator Py at the antiresonance frequency is lowered and the antiresonance frequency is made as far from the second attenuation area as possible. In such a case, it is necessary to make the interval of the resonance frequency and the antiresonance frequency of the second parallel resonator Py as small as possible. Here, by forming the resonator as a slanted type, the interval between the resonance frequency and the antiresonance frequency can be reduced together with the lowering of impedance at the antiresonance frequency. Therefore, for example, by employing a structure where the resonator is formed as a slanted type and the reflectors 4 are eliminated, good characteristics can be obtained.

Figure 22:
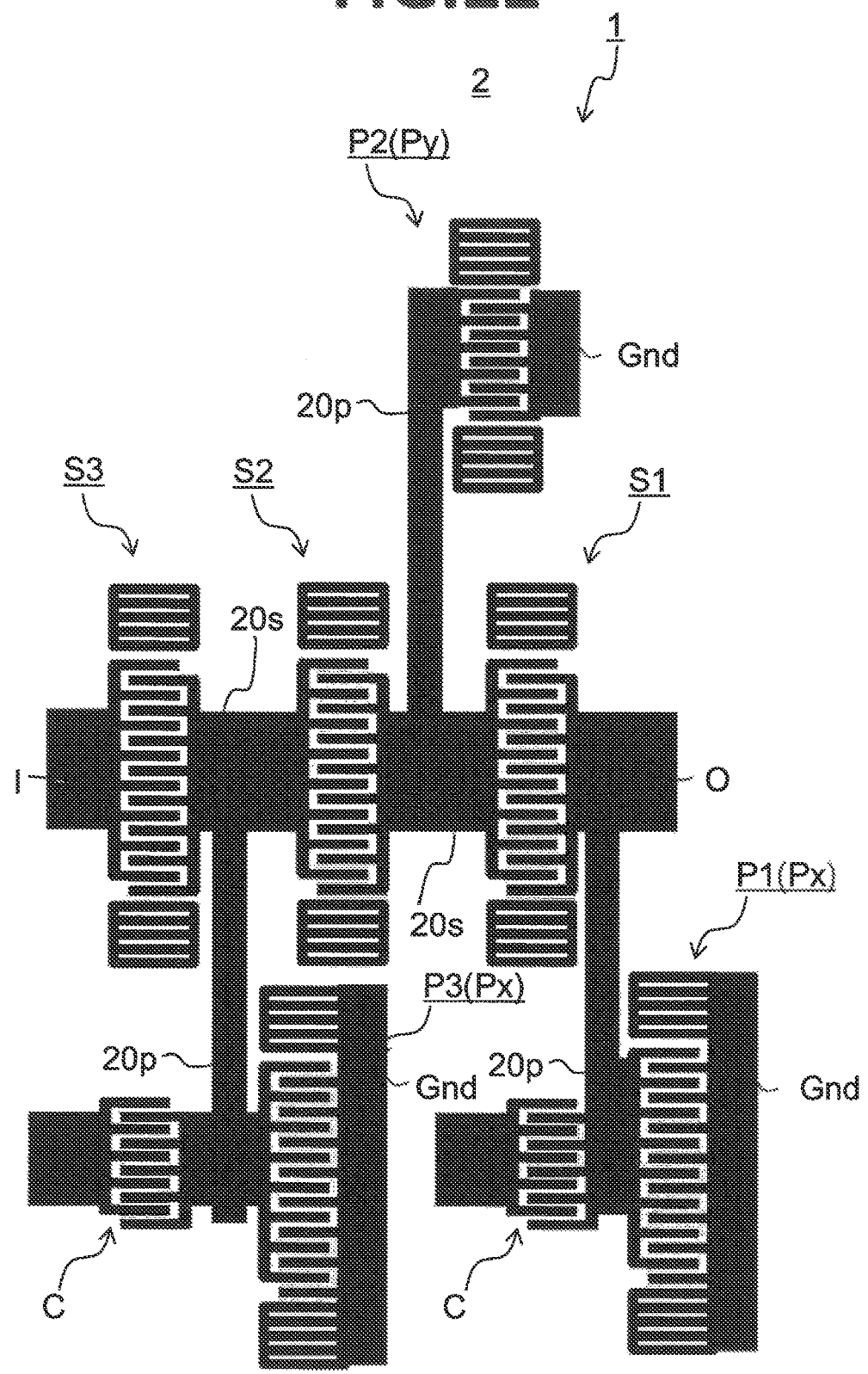
FIG. 22 is a plan view of a modification of a filter.

In the same way, in order to narrow the interval between the resonance frequency and the antiresonance frequency of the second parallel resonator Py, as shown in FIG. 22, an additional capacitance C may be connected parallel to the second parallel resonator Py as well.

Further, in order to position the antiresonance frequency of the second parallel resonator Py outside of the first attenuation area or outside of the second attenuation area, an inductance may be connected in series in order to broaden the interval between the resonance frequency and the antiresonance frequency of the second parallel resonator Py.

Figure 21:
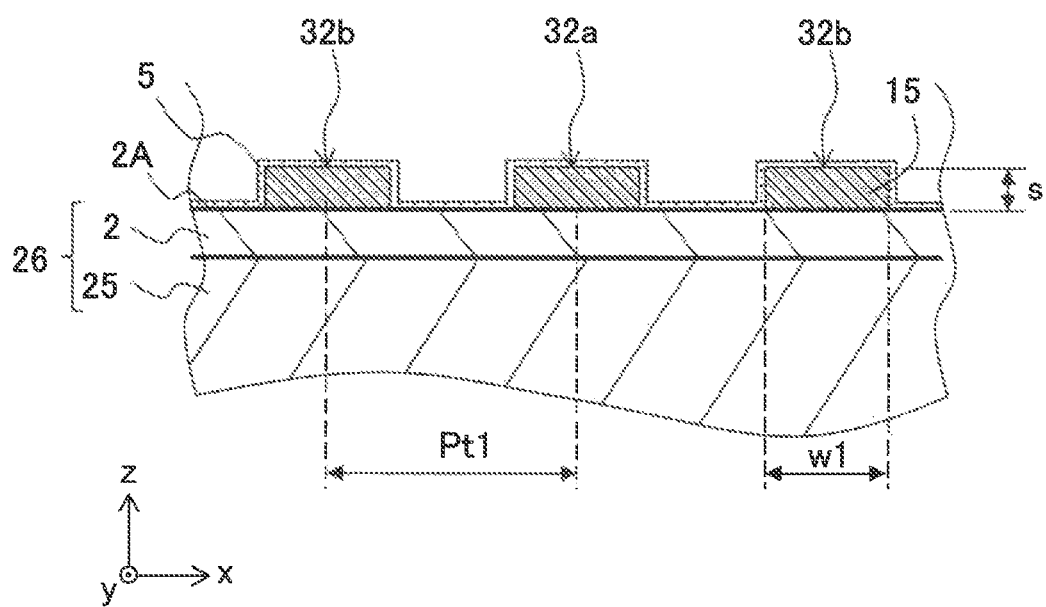
FIG. 21 is a cross-sectional view of a modification of a filter.

Further, in the example explained above, use was made of a single piezoelectric substrate 2. However, as shown in FIG. 21, use may be also made of an element substrate 26 formed by adhering the piezoelectric substrate 2 and a support substrate 25 to each other. Specifically, the element substrate 26 is configured by the piezoelectric substrate 2 and the support substrate 25 which is adhered to the lower surface (second surface) of the piezoelectric substrate 2.

The thickness of the piezoelectric substrate 2 is for example constant. The magnitude thereof may be suitably set in accordance with the field to which the filter 1 is applied and the specifications which are demanded from the filter 1 and so on. As an example, the thickness of the piezoelectric substrate 2 is 1 to 30 μm. The planar shape and various dimensions of the piezoelectric substrate 2 may be suitably set as well.

The support substrate 25 is for example formed by a material having a smaller thermal expansion coefficient than that of the material of the piezoelectric substrate 2. Accordingly, thermal stress is generated in the piezoelectric substrate 2 if the temperature changes. At this time, the temperature dependency and the stress dependency of the elastic constant are cancelled by each other, and consequently the change according to temperature in the electrical characteristic of the filter 1 is compensated for. As such a material, for example, there can be mentioned sapphire or another single crystal, silicon or another semiconductor, and an aluminum oxide-based sintered body or another ceramic. Note that, the support substrate 25 may be configured by laminating a plurality of layers which are formed by materials different from each other as well.

The thickness of the support substrate 25 is for example constant. The thickness thereof may be suitably set in the same way as the thickness of the piezoelectric substrate 2. However, the thickness of the support substrate 25 is set in consideration of the thickness of the piezoelectric substrate 2 so that temperature compensation is suitably carried out. As an example, the thickness of the support substrate 25 is 75 to 300 μm as compared with the thickness of the piezoelectric substrate 2 of 5 to 30 μm. The planar shape and various dimensions of the support substrate 25 are for example equal to those of the piezoelectric substrate 2.

The piezoelectric substrate 2 and the support substrate 25 are for example adhered to each other through a bonding layer. The material of the bonding layer may be an organic material or inorganic material. As the organic material, for example, there can be mentioned a thermosetting resin or other resin. As the inorganic material, for example, there can be mentioned $SiO_2$. Further, the two substrates may be adhered to each other by so-called direct bonding as well in which the bonding surfaces are subjected to activation treatment by plasma, an ion gun, neutron gun, or the like, and then they are bonded without a bonding layer.

EXAMPLES

In order to confirm the effects of the filter 1 in the present embodiment, a model of the filter 1 was set and a simulation was performed to evaluate the results. The basic configuration of the model SAW element is as follows.

[Piezoelectric Substrate 2]
Material: 46° Y-cut X-propagated $LiTaO_3$ substrate
Thickness: 15 to 30 μm
Note that, the Si substrate is adhered to the back surface of the piezoelectric substrate 2.

Figure 9:
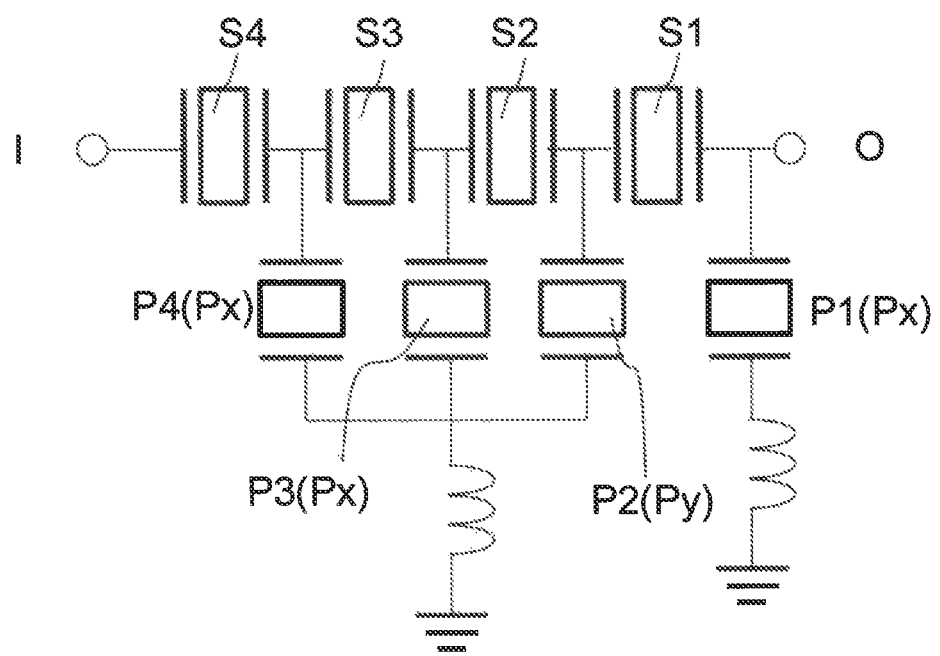
FIG. 9 is a schematic view of a model of a filter according to an embodiment.

[IDT Electrode 3]
Material: Al—Cu alloy
(However, between the piezoelectric substrate 2 and the conductive layer 15, there is an underlying layer of 6 nm made of Ti.)
Thickness (Al—Cu alloy layer): 176 nm Electrode fingers 32 of IDT electrode 3:
(Duty: w1/Pt1) 0.5
(Crossing width W) 10 to 30λ (λ=2×Pt1)
(Number of electrodes) 150 to 500
(Electrode pitch) 1.0 to 1.2 μm
[Reflectors 4]
Material: Al—Cu alloy
(However, there is an underlying layer of 6 nm made of Ti between the piezoelectric substrate 2 and the conductive layer 15.)
Thickness (Al—Cu alloy layer): 176 nm
Number of reflection electrode fingers 42: 30
Pitch Pt2 of reflection electrode fingers 42: 1.0 to 1.2 μm
[Protective Layer 5]
Material: $SiO_2$
Thickness: 15 nm Using a SAW element having such a basic configuration, as Example 1, a filter element was formed in which four serial resonators S1 to S4 and four parallel resonators P1 to P4 were connected in a ladder type as shown in FIG. 9. Further, the parallel resonator P2 was made the second parallel resonator Py.
[Basic Configuration of Py]
Material: Al—Cu alloy
(However, there is an underlying layer of 6 nm made of Ti between the piezoelectric substrate 2 and the conductive layer 15.)
Thickness (Al—Cu alloy layer): 176 nm
Electrode fingers 32 of IDT electrode 3:
(Duty: w1/Pt1) 0.5
(Crossing width W) 7λ (λ=2×Pt1)
(Number of electrode) 50
(Electrode pitch) 1.02 μm
[Reflectors 4]
Material: Al—Cu alloy
(However, there is an underlying layer of 6 nm made of Ti between the piezoelectric substrate 2 and the conductive layer 15.)
Thickness (Al—Cu alloy layer): 176 nm
Number of reflection electrode fingers 42: 20
Pitch Pt2 of reflection electrode fingers 42: 1.02 μm
[Protective Layer 5]
Material: $SiO_2$
Thickness: 15 nm Example 1

In addition to the basic configuration explained above, as Example 1, the configuration of the second parallel resonator Py was set by using the example of the first embodiment as a model. Specifically, the resonance frequency and antiresonance frequency of the serial resonators S1 to S4 were set to approximately 1760 MHz and approximately 1820 MHz respectively, the resonance frequency and antiresonance frequency of the first parallel resonator Px were set to approximately 1700 MHz and approximately 1810 MHz respectively, and the resonance frequency and antiresonance frequency of the second parallel resonator Py were set to 1880 MHz and 1920 MHz respectively. Further, in contrast to the electrostatic capacity of the first parallel resonator Px being set to approximately 3 pF, the electrostatic capacity of the second parallel resonator Py was set to approximately 0.7 pF. However, the reflectors 4 in the first parallel resonator Px and the second parallel resonator Py were formed as floating electrodes in the same way as the serial resonators S1 to S4.

Contrary to this, as a comparative example, an example not provided with the second parallel resonator Py was prepared.

The filter characteristics of a filter of Example 1 and a filter of the comparative example like the above are shown in FIG. 10. In FIG. 10, an abscissa shows the frequencies, an ordinate shows the attenuations, a broken line shows the characteristics of the filter according to the comparative example, and a solid line shows the characteristics of the filter according to Example 1.

As apparent also from this graph, it could be confirmed that the attenuation could be increased in a high frequency side area outside of the passband (in particular 1850 MHz to 1890 MHz) by providing a resonator having a resonance frequency higher than the passband on the parallel arm.

Example 2

Figure 11A:
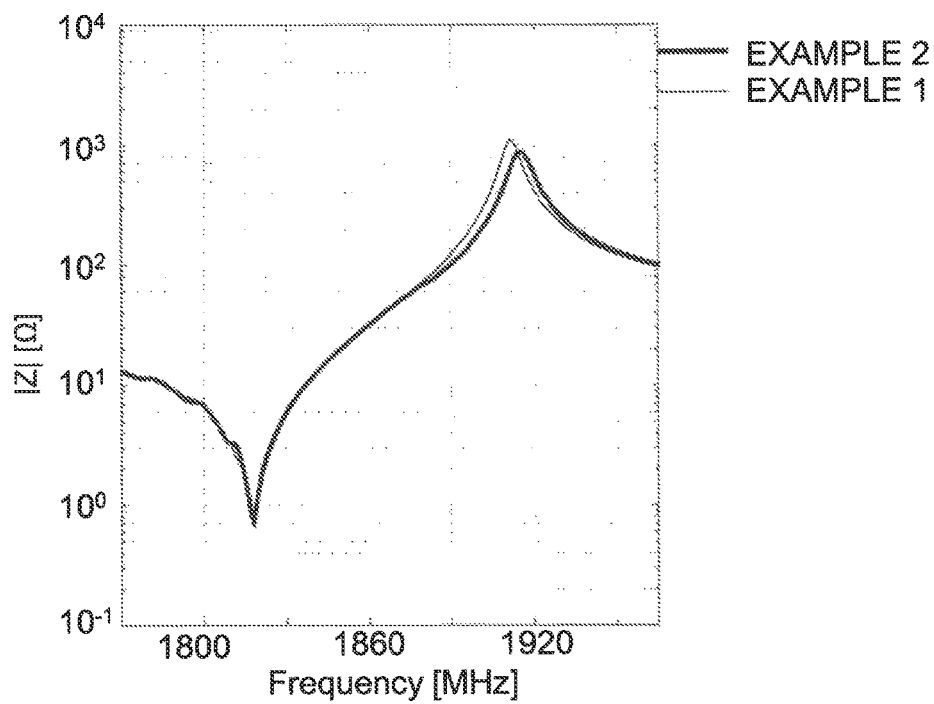
FIG. 11A is a graph showing characteristics of second parallel resonators Py according to Example 1 and Example 2.
Figure 11B:
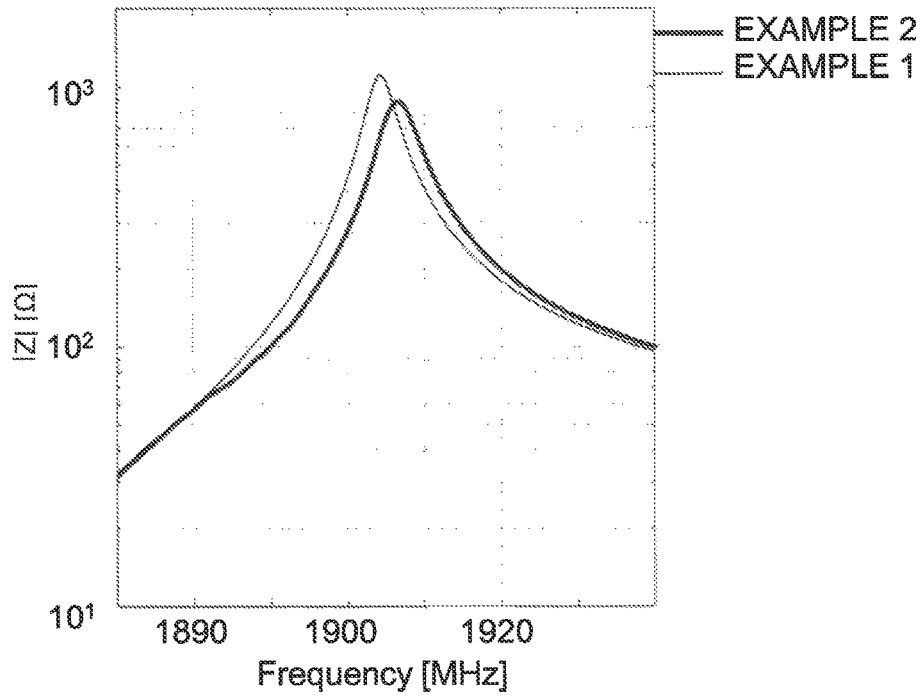
FIG. 11B is a view enlarging the characteristics in a vicinity of an antiresonance frequency in FIG. 11A.

Next, as Example 2, a simulation was carried out for a case where the second parallel resonator Py was configured as in the example of the second embodiment. The impedance characteristics of the second parallel resonators in Example 1 and Example 2 are shown in FIG. 11A, and the impedance characteristics in the vicinity of the antiresonance frequency are shown in FIG. 11B. In FIG. 11A and FIG. 11B, the abscissas show the frequencies, the ordinates show the impedances, the solid lines show the characteristics according to Example 1, and the bold lines show the characteristics according to Example 2.

As apparent also from these graphs, regarding the second parallel resonator Py in Example 2, it was seen that the antiresonance characteristic became blunter, and the impedance became small.

Next, FIG. 12 shows the filter characteristics of Example 1 and Example 2. In FIG. 12, the abscissa shows the frequencies, the ordinate shows the attenuations, the solid line shows the characteristics of the filter according to Example 1, and the bold line shows the characteristics of the filter according to Example 2.

As apparent also from this graph, it could be confirmed that the filter according to Example 2 obtained an attenuation having a value equal to that in Example 1 in the vicinity of 1880 MHz and could improve the attenuation in the vicinity of 1920 MHz by about 7 dB. Note that, in Example 1 and Example 2, equal characteristics were obtained in the insertion loss and in isolation from the second filter 12 (Rx filter), so there was no problem.

From the above description, it could be confirmed that a high attenuation could be obtained in a further broader range by forming the reflectors 4 as open types.

Example 3

Next, as Example 3, a simulation was carried out for a case where the second parallel resonator Py was configured as in the example of the third embodiment. The filter characteristics in Example 2 and Example 3 are shown. In FIG. 13, the abscissa shows the frequencies, the ordinate shows the attenuations, the bold line shows the characteristics of the filter according to Example 2, and the solid line shows the characteristics of the filter according to Example 3.

As apparent also from this graph, it could be confirmed that, in the filter according to Example 3, equal values to those in Example 2 were obtained as both of the attenuation in the vicinity of 1880 MHz and the attenuation in the vicinity of 1920 MHz. Note that, in Example 2 and Example 3, equal characteristics are obtained in the insertion loss and in isolation from the second filter 12 (Rx filter), so there is no problem.

From the above description, it could be confirmed that a high attenuation could be obtained in a wide range even if the reflectors 4 were eliminated.

Example 4

Next, as Example 4, a simulation was carried out for a case where the reflectors 4 in the first parallel resonator Px were connected to the reference potential, and the reflectors 4 in the second parallel resonator Py were formed as floating electrodes in the same way as the serial resonators S1 to S4.

The basic configuration of the model SAW element is as follows.

Figure 17:
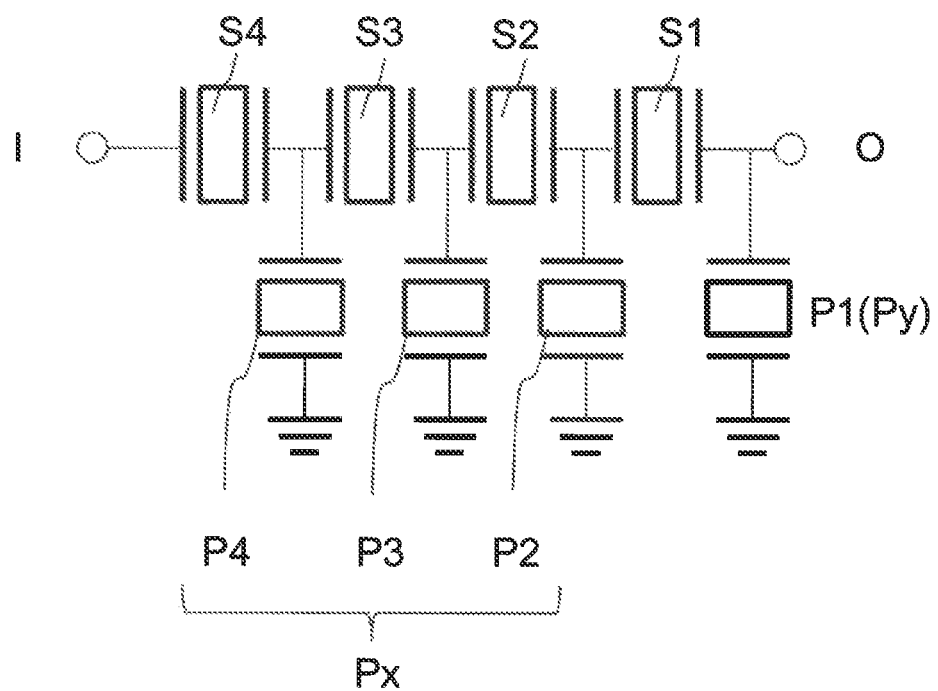
FIG. 17 is a schematic view of a model of a filter element according to an embodiment.

[Piezoelectric Substrate 2]
Material: 46° Y-cut X-propagated $LiTaO_3$ substrate
[IDT Electrode 3]
Material: Al—Cu alloy
(However, there is an underlying layer of 6 nm made of Ti between the piezoelectric substrate 2 and the conductive layer 15.)
Thickness (Al—Cu alloy layer): 414 nm
Electrode fingers 32 of IDT electrode 3:
(Duty: w1/Pt1) 0.5
(Crossing width W) 10 to 30λ (λ=2×Pt1)
(Number of electrodes) 120 to 200
(Electrode pitch) 2.25 to 2.45 μm
[Reflectors 4]
Material: Al—Cu alloy
(However, there is an underlying layer of 6 nm made of Ti between the piezoelectric substrate 2 and the conductive layer 15.)
Thickness (Al—Cu alloy layer): 414 nm
Number of reflection electrode fingers 42: 20
Pitch Pt2 of reflection electrode fingers 42: 2.25 to 2.45 μm
[Protective Layer 5]
Material: $SiO_2$
Thickness: 15 nm Using the SAW element having such a basic configuration, as Example 4, a filter was formed in which four serial resonators S1 to S4 and four parallel resonators P1 to P4 were connected in a ladder type as shown in FIG. 17. Further, the parallel resonator P4 was made the second parallel resonator Py.

[Basic Configuration of Py]
Material: Al—Cu alloy
(However, there is an underlying layer of 6 nm made of Ti between the piezoelectric substrate 2 and the conductive layer 15.)
Thickness (Al—Cu alloy layer): 414 nm
Electrode fingers 32 of IDT electrode 3:
(Duty: w1/Pt1) 0.5
(Crossing width W) 7λ (λ=2×Pt1)
(Number of electrodes) 50
(Electrode pitch) 2.14 μm
[Reflectors 4]
Material: Al—Cu alloy
(However, there is an underlying layer of 6 nm made of Ti between the piezoelectric substrate 2 and the conductive layer 15.)
Thickness (Al—Cu alloy layer): 414 nm
Number of reflection electrode fingers 42: 20
Pitch Pt2 of reflection electrode fingers 42: 2.14 μm
[Protective Layer 5]
Material: $SiO_2$
Thickness: 15 nm Note that, the reflectors 4 in the serial resonators S1 to S4 were formed as floating electrodes, and the reflectors 4 in the parallel resonators P1 to P3 were connected to the reference potential. Further, the reflectors 4 in the parallel resonator P4 were formed as floating electrodes. The capacity of the parallel resonator P4 was set to 4 pF corresponding to about 7% of the capacity of the other parallel resonators.

Contrary to this, a filter not provided with a second parallel resonator Py was prepared as Comparative Example 2, while a filter connecting the reflectors 4 in the parallel resonator P4 to the reference potential was prepared as Comparative Example 3.

Figure 18:
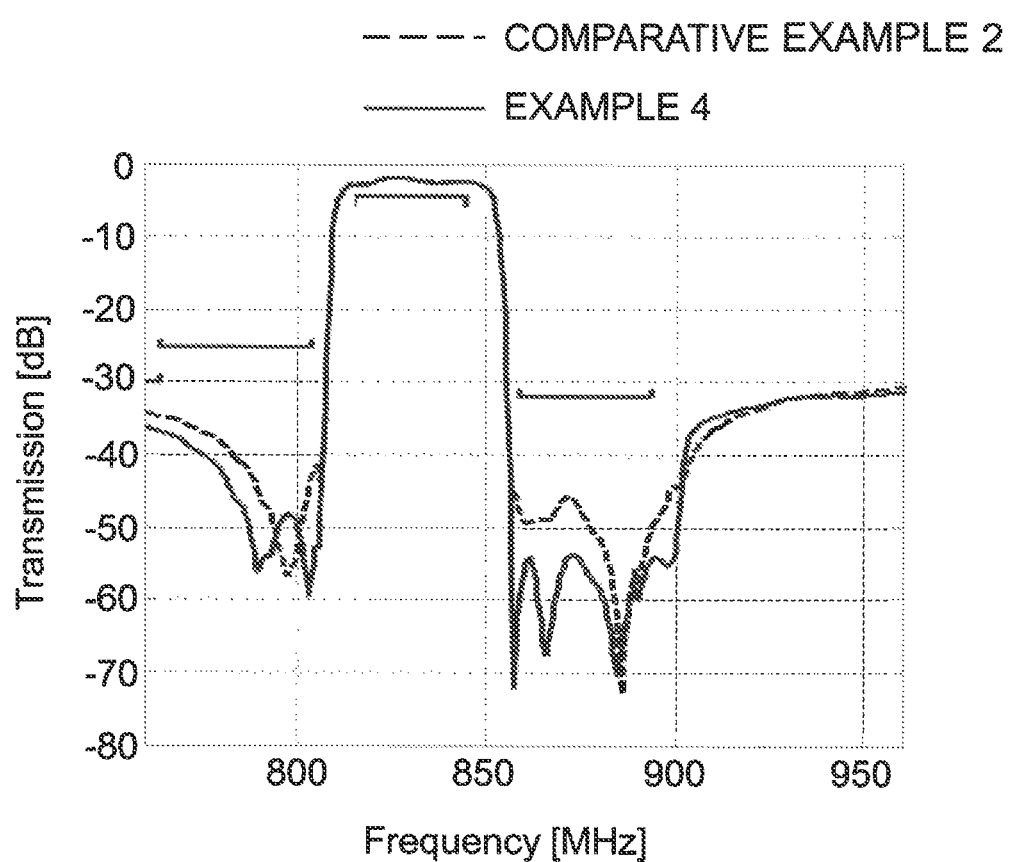
FIG. 18 is a graph showing results of simulation of filter characteristics of filter elements according to Example 1 and Comparative Example 1.
Figure 19:
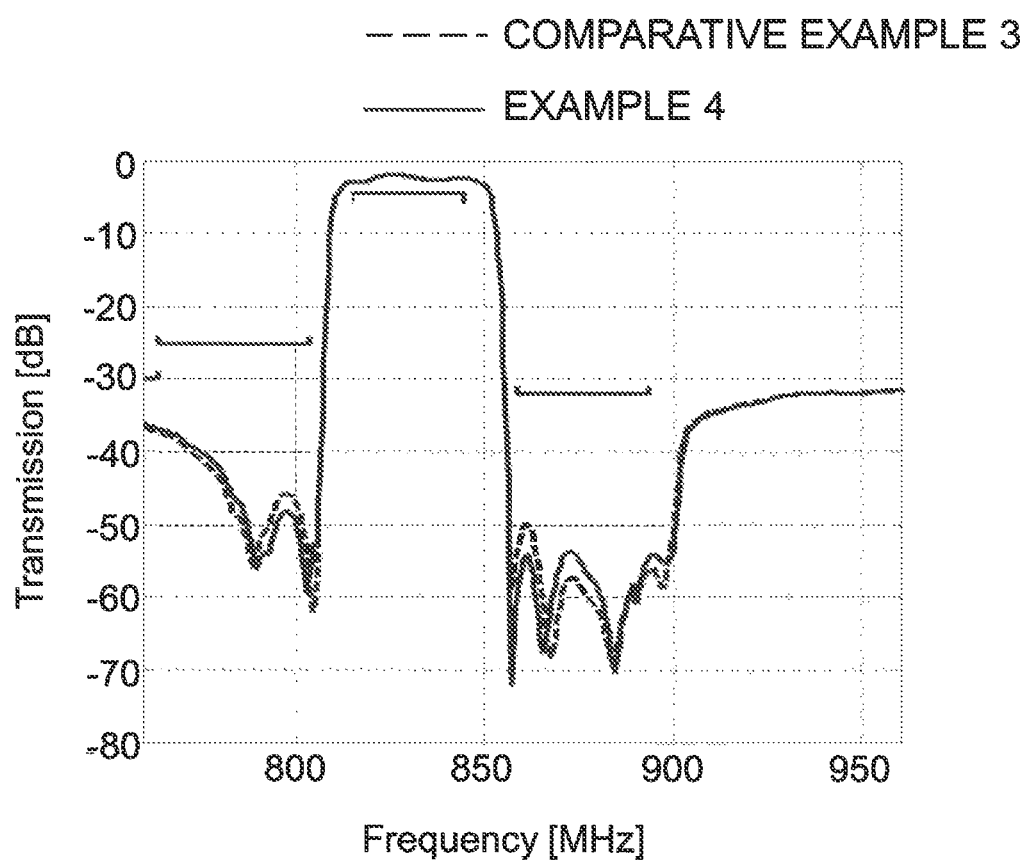
FIG. 19 is a graph showing results of simulation of filter characteristics of filter elements according to Example 1 and Comparative Example 2.

The filter characteristics in the filter element of Example 4 and in the filter element of Comparative Example 2 are shown in FIG. 18, and the filter characteristics in the filter element of Example 4 and the filter element of Comparative Example 3 are shown in FIG. 19. In FIG. 18 and FIG. 19, the abscissas show the frequencies, and the ordinates show the attenuation. In both graphs, the characteristics of the filters according to the comparative examples (Comparative Example 2 and Comparative Example 3) are indicated by the broken lines, and the characteristics of the filter 1 according to Example 4 are indicated by the solid line.

As apparent also from these graphs, it could be confirmed that by providing a resonator having a resonance frequency higher than the passband on the parallel arm and further forming that reflectors as floating electrodes, the attenuation could be increased in a high frequency side region outside of the passband. In particular, by connecting the reflectors in the second parallel resonator Py to the floating potential, the maximum value in the attenuation area positioned on the high frequency side outside of the passband can be reduced. Further, it could be confirmed that the loss did not increase either.

Note that, in the example explained above, the reflectors 4 in the serial resonators S1 to S4 were formed as the floating electrodes, and the reflectors 4 in the parallel resonators P1 to 3 were given the ground potential. The effects by this will be verified. Specifically, the filter characteristics were measured in the same way for Comparative Example 4 in which the reflectors 4 in all of the resonators S1 to S4 and P1 to P4 were formed as the floating electrodes, and for Comparative Example 5 in which the reflectors 4 in the parallel resonators P1 to P4 were connected to the ground potential.

The basic configurations of Comparative Examples 4 and 5 were determined as follows.

Figure 20A:
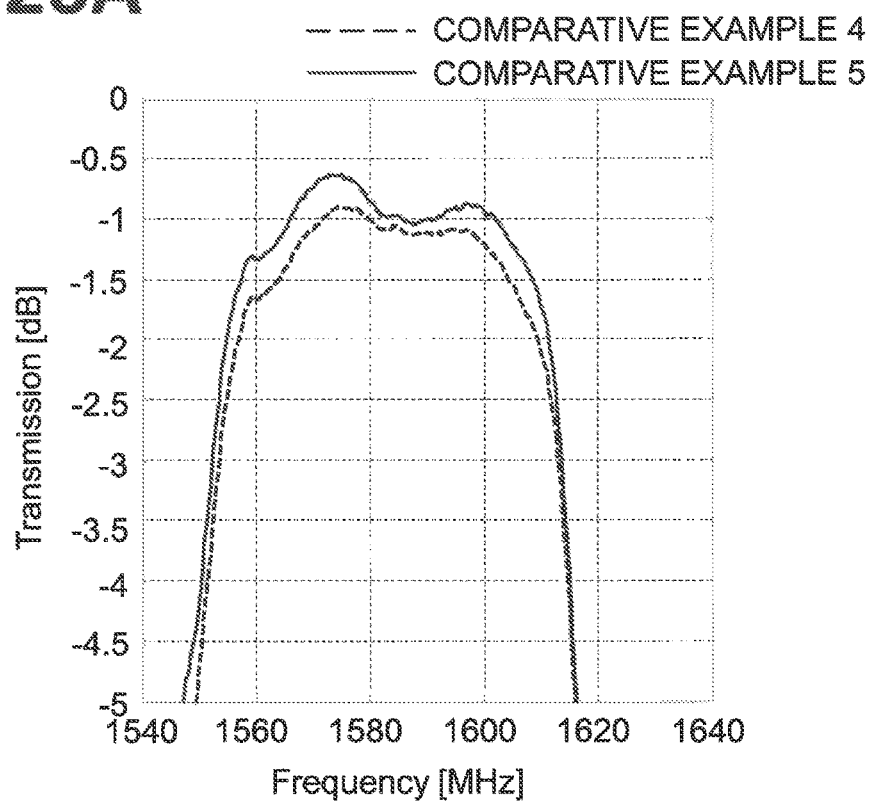
FIG. 20A is a graph showing the results of simulation of filter characteristics in the vicinity of a passband of the filter elements according to Comparative Examples 3 and 4.
Figure 20B:
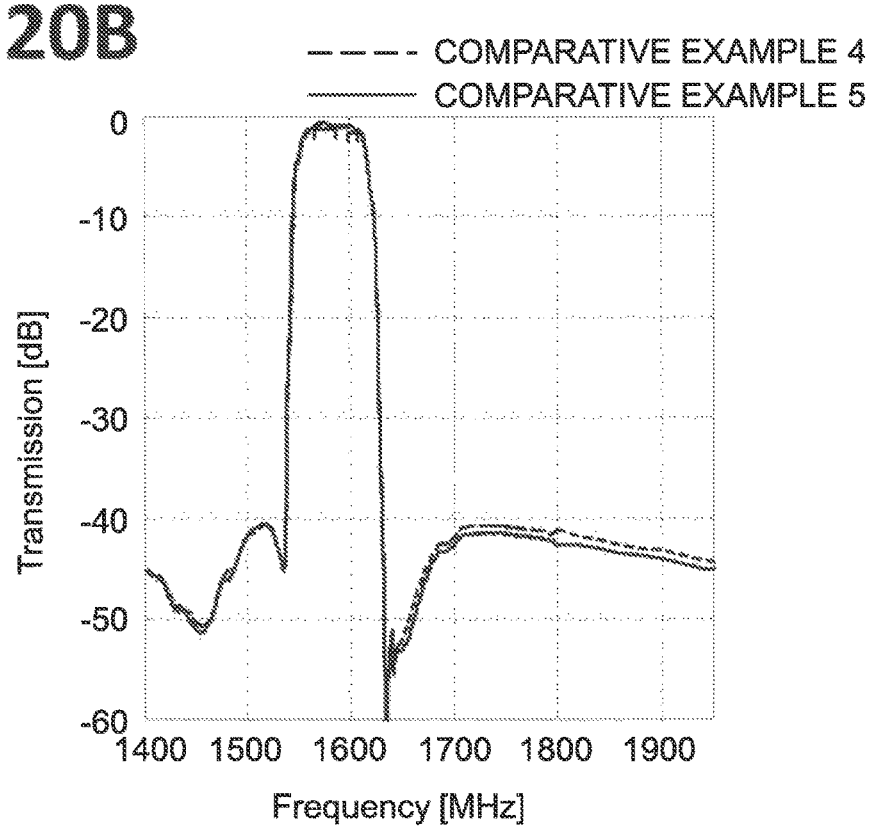
FIG. 20B is a graph showing the results of simulation of filter characteristics out of the passband of the filter elements according to Comparative Examples 3 and 4.

[Piezoelectric Substrate 2]
Material: 38.7° Y-cut X-propagated $LiTaO_3$ substrate
[IDT Electrode 3]
Material: Al—Cu alloy
Thickness (Al—Cu alloy layer): 198 nm
Electrode fingers 32 of IDT electrode 3:
(Duty: w1/Pt1) 0.55
(Crossing width W) 10 to 30× (λ=2×Pt1)
(Number of electrodes) 50 to 400
(Electrode pitch) 1.1 to 1.4 μm
[Reflector 4]
Material: Al—Cu alloy
Thickness (Al—Cu alloy layer): 198 nm
Number of reflection electrode fingers 42: 20 to 30
Pitch Pt2 of reflection electrode fingers 42: 1.1 to 1.4 μm
[Protective Layer 5]
Material: $SiO_2$
Thickness: 15 nm FIG. 20 show the filter characteristics of Comparative Examples 4 and 5. In FIG. 20, the abscissas show the frequencies and the ordinates show the attenuation, the characteristics of Comparative Example 4 are indicated by the broken lines, and the characteristics of Comparative Example 5 are indicated by the solid lines. As apparent also from FIG. 20A, it is seen that the loss of the passband is improved by about 0.3 dB in Comparative Example 5. In the same way, as apparent also from FIG. 20B, it is seen that the loss out of the passband is improved by about 0.3 dB in Comparative Example 5.

In this way, by making the reflectors 4 in the serial resonators S float and connecting the reflectors 4 in the parallel resonators P to the ground, it was confirmed that the loss was improved inside and outside the passband. Due to the above, it was confirmed that the loss was improved by connecting the parallel resonators P1 to P3 other than the second parallel resonator Py to the ground.

It was confirmed from Examples 1 to 4 explained above that the out-of-band attenuation was improved by providing the second parallel resonator Py.

REFERENCE SIGNS LIST 1. filter, 2. piezoelectric substrate, 2A. upper surface, 3. IDT electrode, 4. reflector, 42. strip (reflection electrode finger), 7. multiplexer, 8. first terminal, 9. second terminal, 10. third terminal, 11. first filter, 12. second filter, 101. communication apparatus, 103. RF-IC, 109. antenna, I. input port O. output port, S1 to S3. serial resonators, P1 to P3. parallel resonators, Px. first parallel resonator, and Py second parallel resonator.

The invention claimed is:

1. A filter comprising:
   an input port,
   an output port, and
   a plurality of serial resonators and a plurality of parallel resonators connected in a ladder-shaped circuit between the input port and the output port and comprising interdigital transducer (IDT) electrodes,
   wherein the plurality of parallel resonators comprises
      at least one first parallel resonator having a resonance frequency lower than resonance frequencies of the plurality of serial resonators and
      at least one second parallel resonator having a resonance frequency higher than antiresonance frequencies of the plurality of serial resonators,
      wherein the at least one first parallel resonator and the at least one second parallel resonator comprise reflectors which are arranged on the two sides of the IDT electrodes in a propagation direction of an acoustic wave, the reflector in the at least one first parallel resonator is connected to a reference potential, and the reflector in the at least one second parallel resonator is given floating potential.

2. The filter according to claim 1, wherein each of the at least one second parallel resonator comprises open type reflectors arranged on the two sides of the IDT electrode in a propagation direction of an acoustic wave and comprising pluralities of strips.

3. The filter according to claim 1, wherein each of the at least one first parallel resonator and the at least one second parallel resonator comprises reflectors arranged on the two sides of the IDT electrode in a propagation direction of an acoustic wave and comprising pluralities of strips, and the number of strips of the reflector in the at least one second parallel resonator is smaller than the number of strips of the reflector in the at least one first parallel resonator.

4. The filter according to claim 3, wherein the reflector provided in the at least one second parallel resonator is open type.

5. The filter according to claim 1, wherein the plurality of serial resonators comprise reflectors on the two sides of the IDT electrodes in the propagation direction of the acoustic wave, and at least one reflector of the plurality of serial resonators is given floating potential.

6. The filter according to claim 1, wherein the at least one second parallel resonator has the resonance frequency higher than a passband.

7. The filter according to claim 1, wherein, in the at least one second parallel resonator, the IDT electrode comprises a plurality of first electrode fingers and a plurality of second electrode fingers which cross them, the plurality of first electrode fingers and the plurality of second electrode fingers are connected to potentials which are different from each other, and a virtual line connecting the front ends of the plurality of first electrode fingers is inclined relative to the propagation direction of the acoustic wave.

8. The filter according to claim 1, wherein, in the at least one second parallel resonator, the IDT electrode comprises a plurality of first electrode fingers and a plurality of second electrode fingers which cross them, the plurality of first electrode fingers and the plurality of second electrode fingers are connected to potentials which are different from each other, and the plurality of first electrode fingers include two or more adjacent electrode fingers which are arranged side by side.

9. The filter according to claim 1, wherein the at least one second parallel resonator has a smaller electrostatic capacity compared with the at least one first parallel resonator.

10. The filter according to claim 1, wherein the at least one first parallel resonator is provided on a side nearest the output port among the plurality of parallel resonators.

11. A multiplexer comprising:
    a first terminal, a second terminal, and a third terminal and
    a first filter configured by a filter according to claim 1 which is electrically connected between the first terminal and the second terminal and
    a second filter which is electrically connected between the first terminal and the third terminal and has a passband on a higher frequency side than a passband of the first filter.

12. The multiplexer according to claim 11, wherein the resonance frequency of the at least one second parallel resonator is located in the passband of the second filter.

13. A communication apparatus comprising:
    an antenna,
    a multiplexer according to claim 11 which is electrically connected to the antenna, and
    a radio frequency integrated circuit (RF-IC) which is electrically connected to the multiplexer.

* * * * *